United States Patent
Lin et al.

(10) Patent No.: US 12,356,660 B2
(45) Date of Patent: Jul. 8, 2025

(54) MULTI-GATE DEVICE AND RELATED METHODS

(71) Applicant: Taiwan Semiconductor Manufacturing Company, Ltd., Hsinchu (TW)

(72) Inventors: Shih-Hao Lin, Hsinchu (TW); Chih-Chuan Yang, Hsinchu (TW); Chih-Hsuan Chen, Hsinchu (TW); Bwo-Ning Chen, Keelung (TW); Cha-Hon Chou, Hsinchu (TW); Hsin-Wen Su, Hsinchu (TW); Chih-Hsiang Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/366,392

(22) Filed: Aug. 7, 2023

(65) Prior Publication Data
US 2023/0378365 A1  Nov. 23, 2023

Related U.S. Application Data

(62) Division of application No. 17/319,794, filed on May 13, 2021, now Pat. No. 11,949,016.

(51) Int. Cl.
*H10D 30/00* (2025.01)
*H01L 21/02* (2006.01)
(Continued)

(52) U.S. Cl.
CPC ..... *H10D 30/6713* (2025.01); *H01L 21/0259* (2013.01); *H01L 21/26513* (2013.01);
(Continued)

(58) Field of Classification Search
CPC .......... H01L 29/0673; H01L 29/42392; H01L 29/78618; H01L 29/78696; H10D 30/501;
(Continued)

(56) References Cited

U.S. PATENT DOCUMENTS 9,443,847 B2  9/2016  Tsai
9,991,165 B1  6/2018  Huang
(Continued)

*Primary Examiner* — Reema Patel
(74) *Attorney, Agent, or Firm* — Haynes and Boone, LLP

(57) ABSTRACT

A method of fabricating a device includes providing a fin element in a device region and forming a dummy gate over the fin element. In some embodiments, the method further includes forming a source/drain feature within a source/drain region adjacent to the dummy gate. In some cases, the source/drain feature includes a bottom region and a top region contacting the bottom region at an interface interposing the top and bottom regions. In some embodiments, the method further includes performing a plurality of dopant implants into the source/drain feature. In some examples, the plurality of dopant implants includes implantation of a first dopant within the bottom region and implantation of a second dopant within the top region. In some embodiments, the first dopant has a first graded doping profile within the bottom region, and the second dopant has a second graded doping profile within the top region.

20 Claims, 23 Drawing Sheets

(51) Int. Cl.

| | | |
|---|---|---|
| *H01L 21/265* | (2006.01) | |
| *H01L 21/266* | (2006.01) | |
| *H10D 30/01* | (2025.01) | |
| *H10D 30/67* | (2025.01) | |
| *H10D 62/00* | (2025.01) | |
| *H10D 62/10* | (2025.01) | |
| *H10D 62/80* | (2025.01) | |
| *H10D 62/832* | (2025.01) | |
| *H10D 64/01* | (2025.01) | |
| *H10D 84/01* | (2025.01) | |
| *H10D 84/03* | (2025.01) | |
| *H10D 84/85* | (2025.01) | |
| *H10B 10/00* | (2023.01) | |

(52) U.S. Cl.
CPC ........ *H01L 21/2652* (2013.01); *H01L 21/266* (2013.01); *H10D 30/031* (2025.01); *H10D 30/6735* (2025.01); *H10D 30/6757* (2025.01); *H10D 62/021* (2025.01); *H10D 62/118* (2025.01); *H10D 62/121* (2025.01); *H10D 62/80* (2025.01); *H10D 62/832* (2025.01); *H10D 64/017* (2025.01); *H10D 64/018* (2025.01); *H10D 84/0167* (2025.01); *H10D 84/017* (2025.01); *H10D 84/0184* (2025.01); *H10D 84/038* (2025.01); *H10D 84/85* (2025.01); *H10B 10/125* (2023.02)

(58) Field of Classification Search
CPC ............. H10D 30/019; H10D 30/6735; H10D 30/6757; H10D 62/121
See application file for complete search history.

(56) References Cited

U.S. PATENT DOCUMENTS

| | | | |
|---|---|---|---|
| 10,062,688 | B2 | 8/2018 | Yeong |
| 10,312,145 | B2 | 6/2019 | Huang |
| 10,529,803 | B2 | 1/2020 | Yu |
| 10,680,106 | B2 | 6/2020 | More |
| 10,790,391 | B2 | 9/2020 | Singh |
| 2019/0148361 | A1 | 5/2019 | Lu |
| 2019/0312143 | A1* | 10/2019 | Lin .................. H01L 29/66795 |
| 2020/0006488 | A1* | 1/2020 | Mehandru ............... H01L 21/74 |
| 2020/0006559 | A1 | 1/2020 | Mehandru |
| 2020/0105606 | A1 | 4/2020 | Lin |

\* cited by examiner

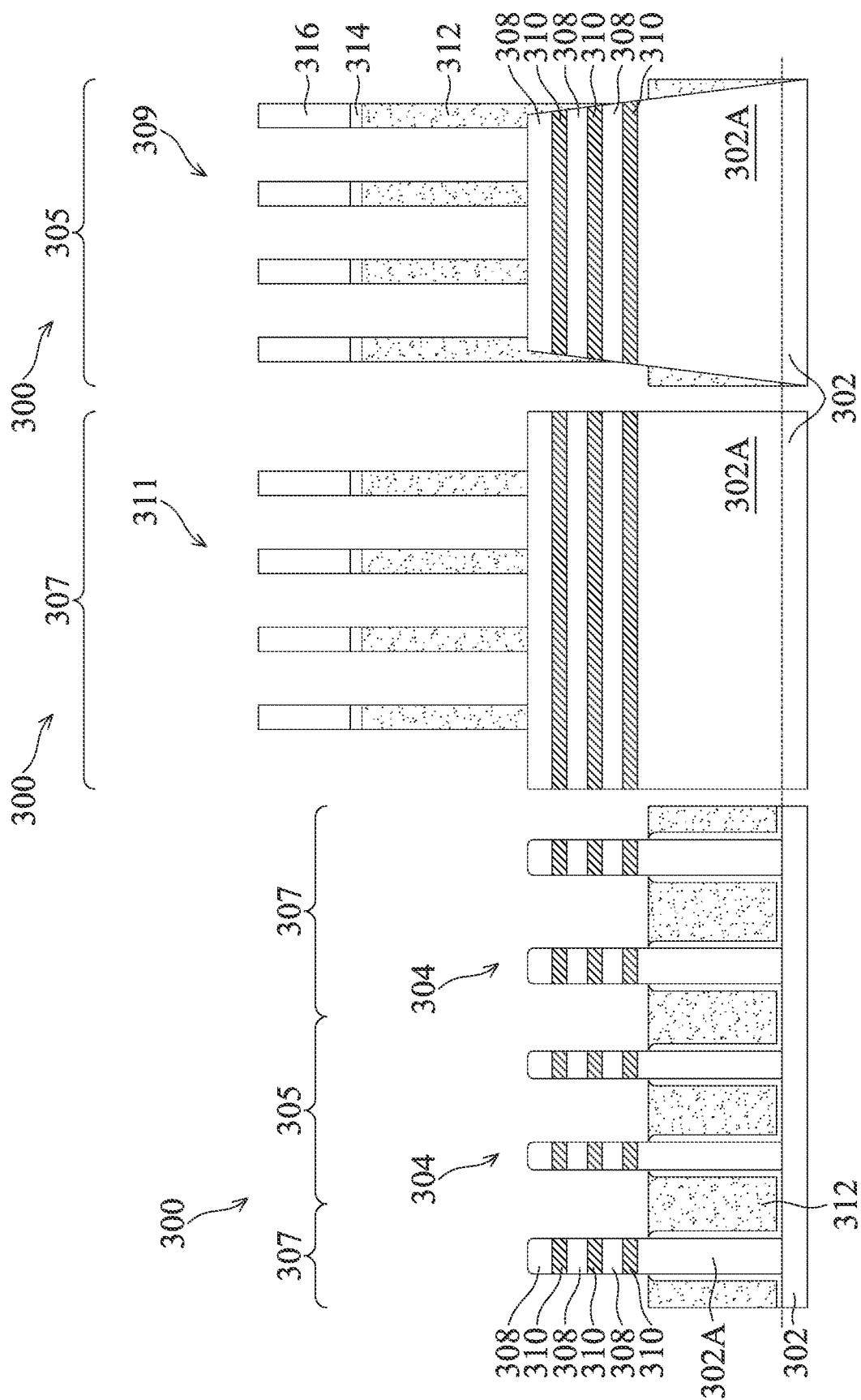

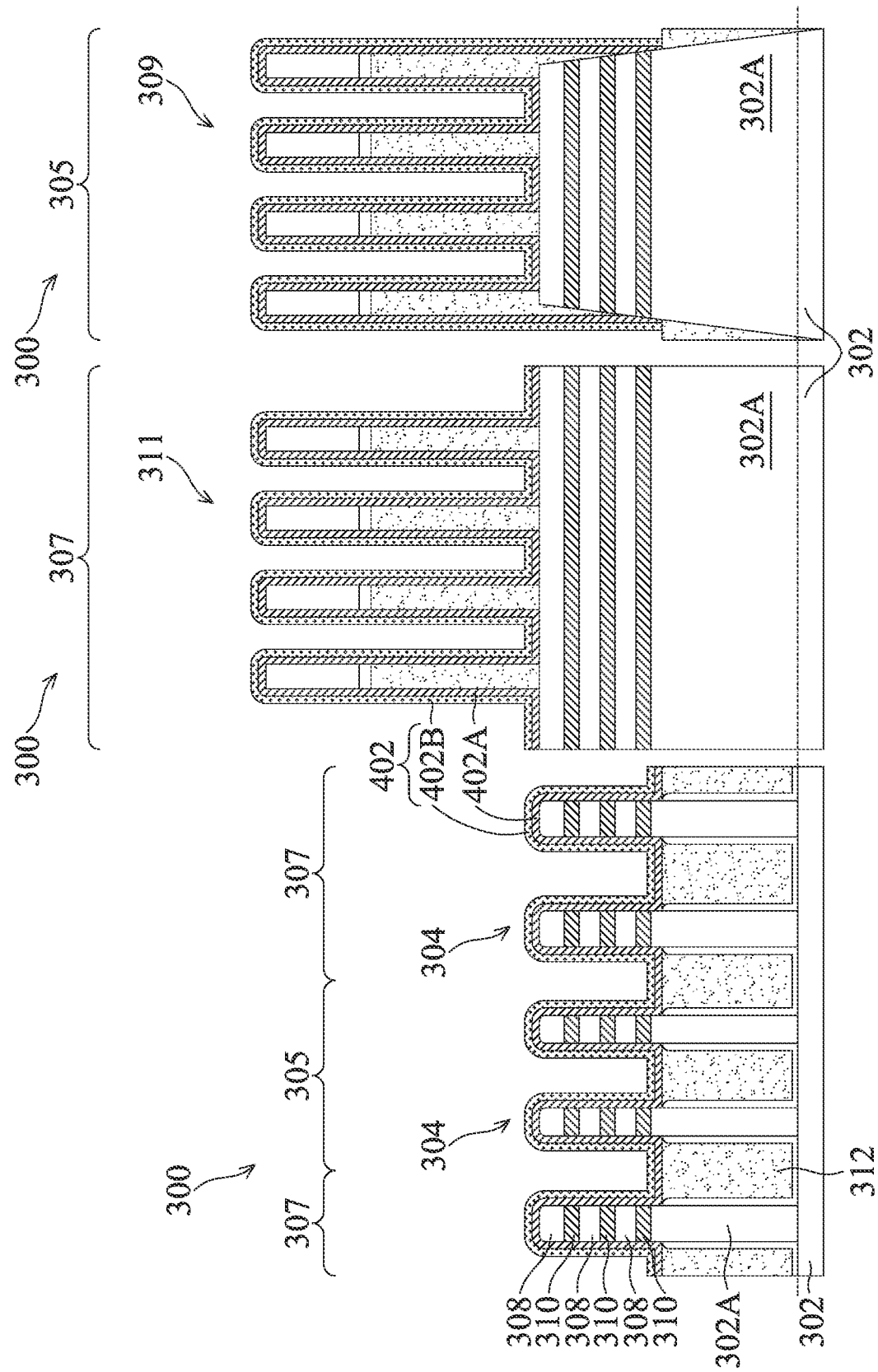

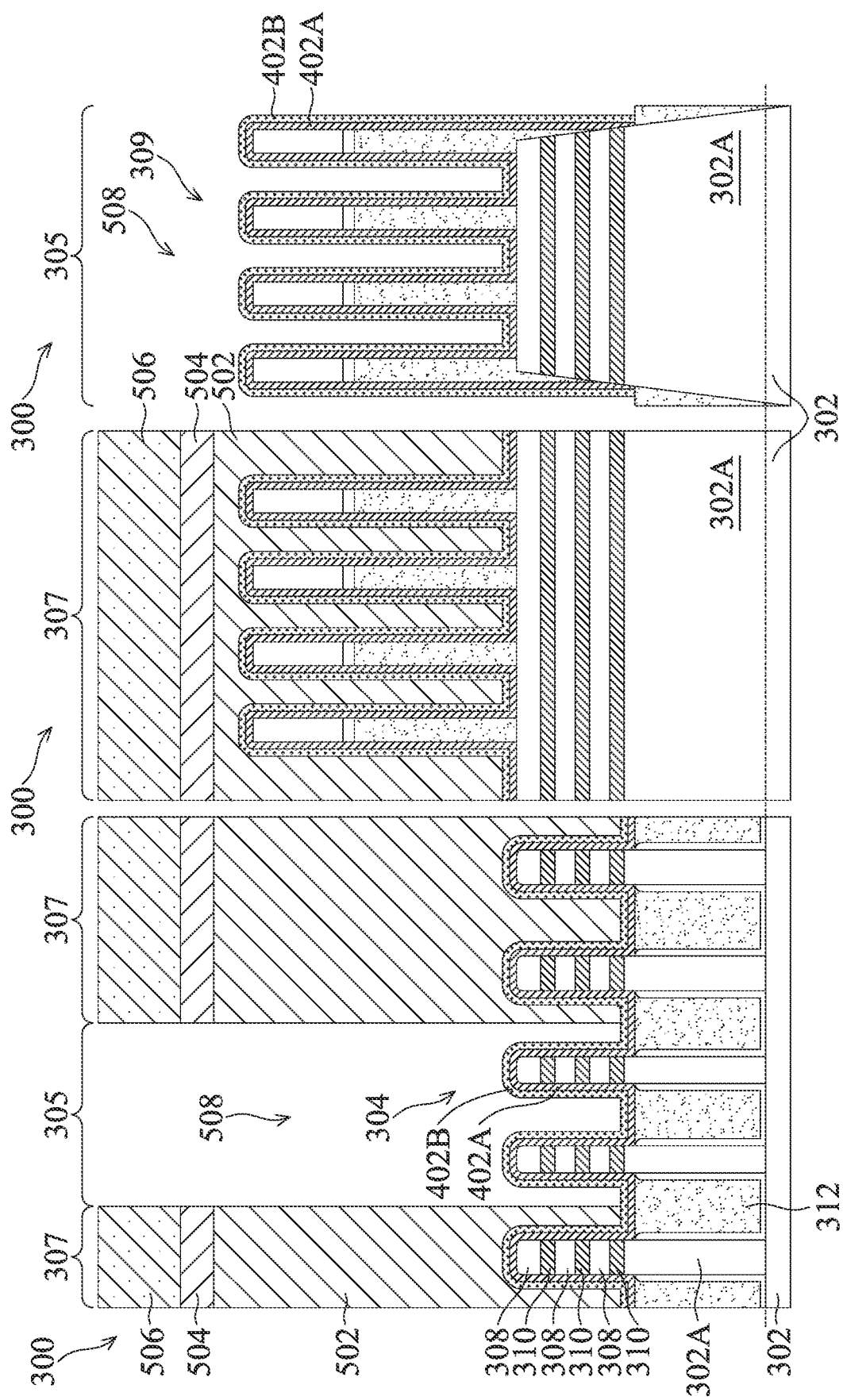

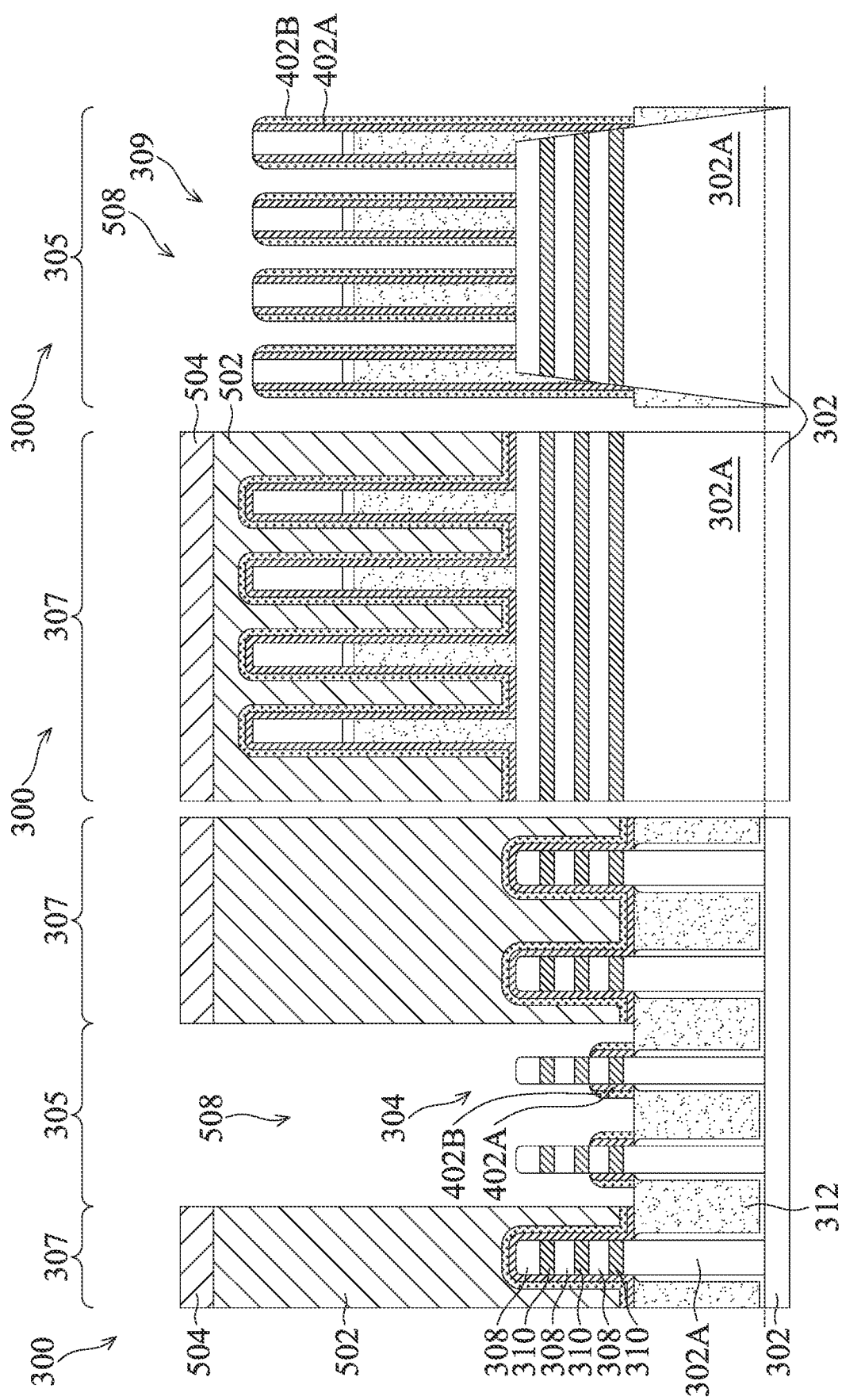

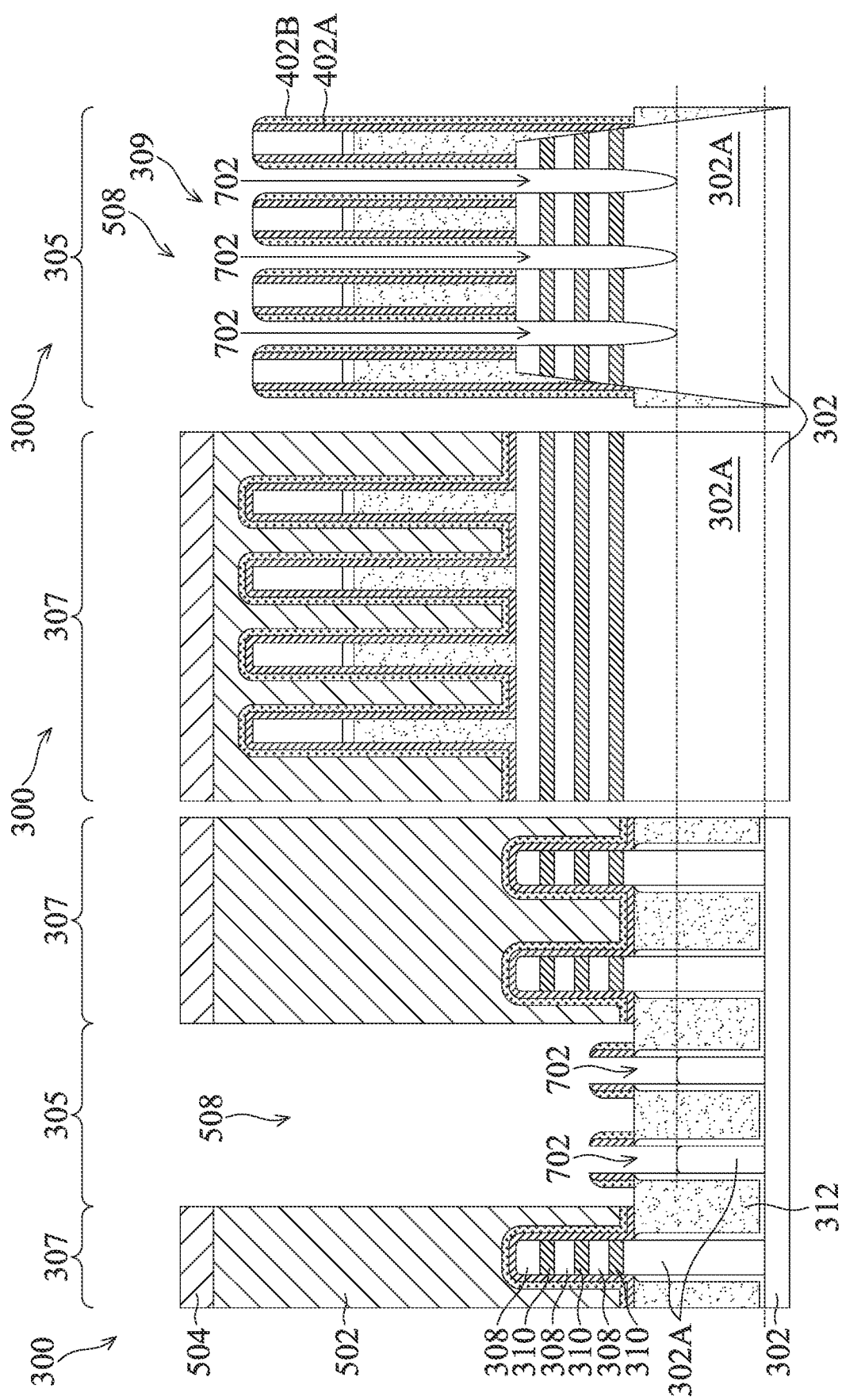

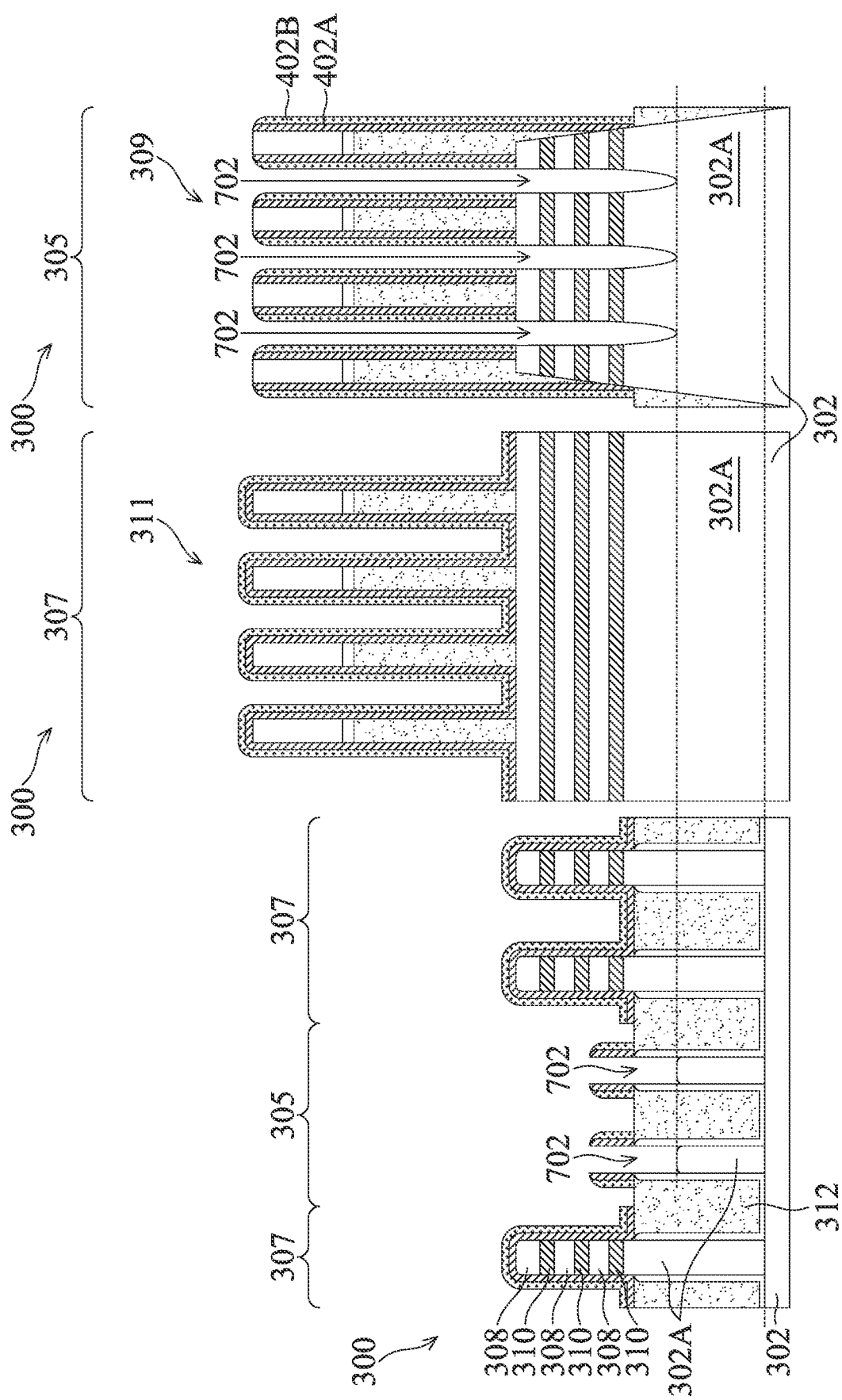

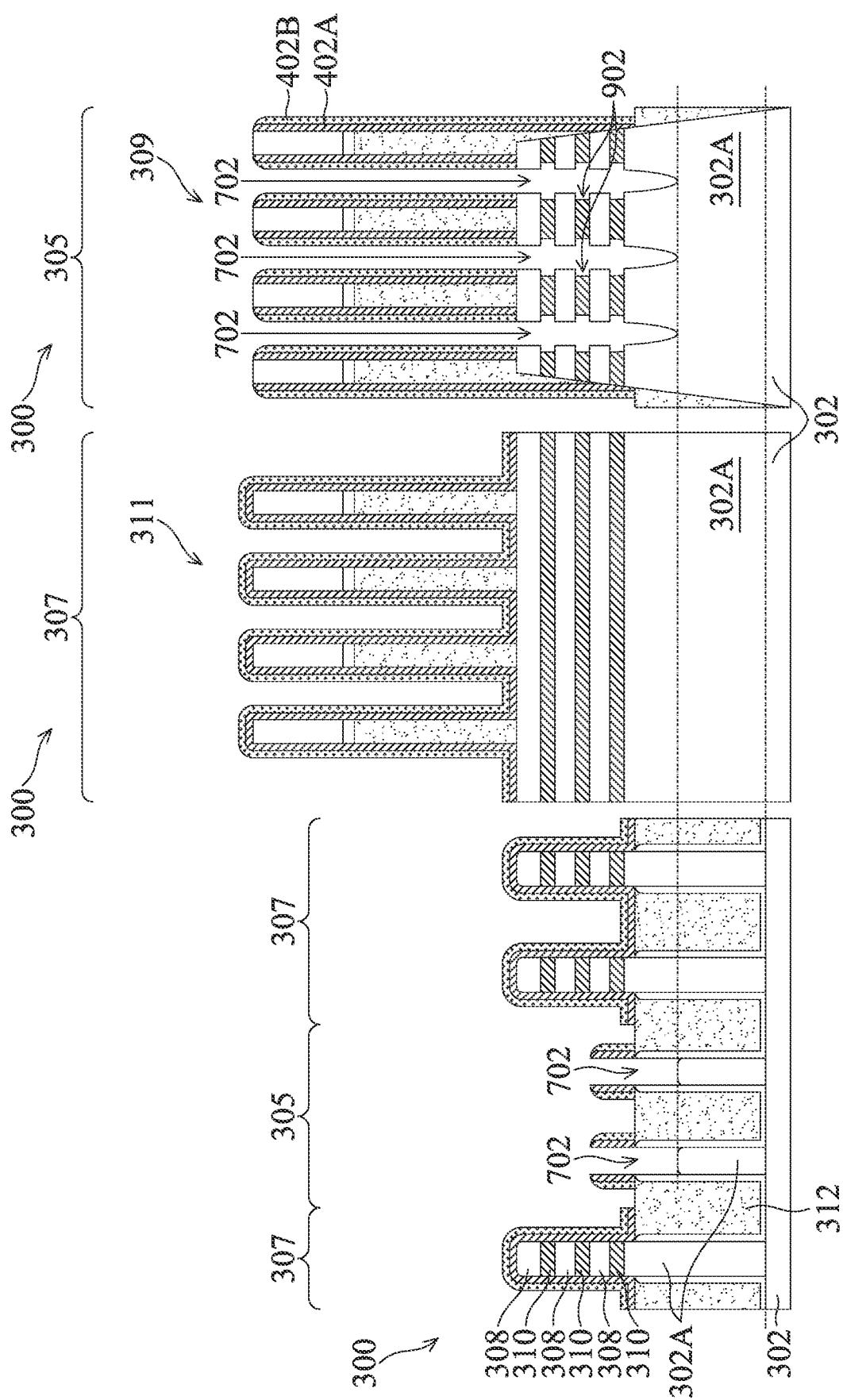

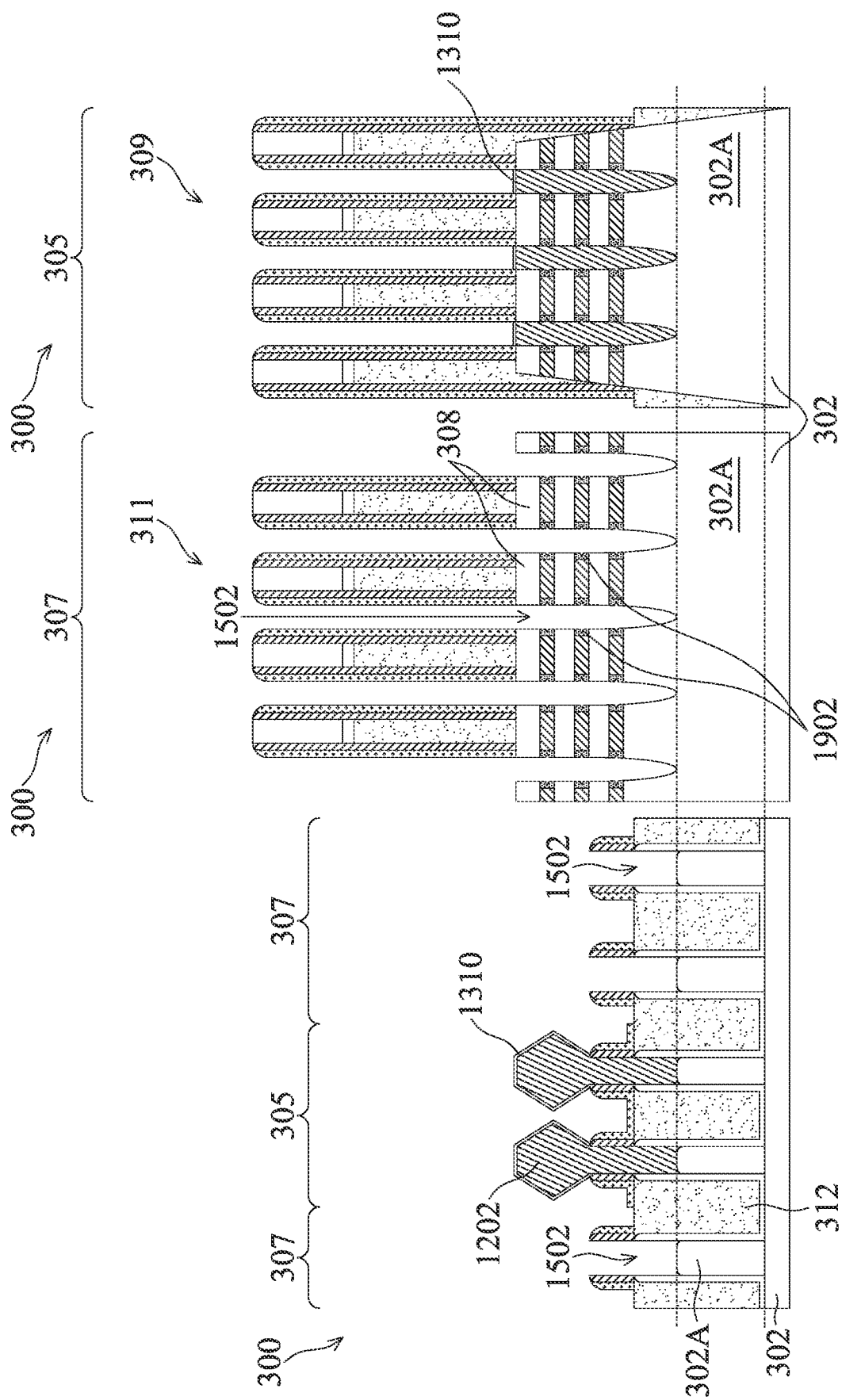

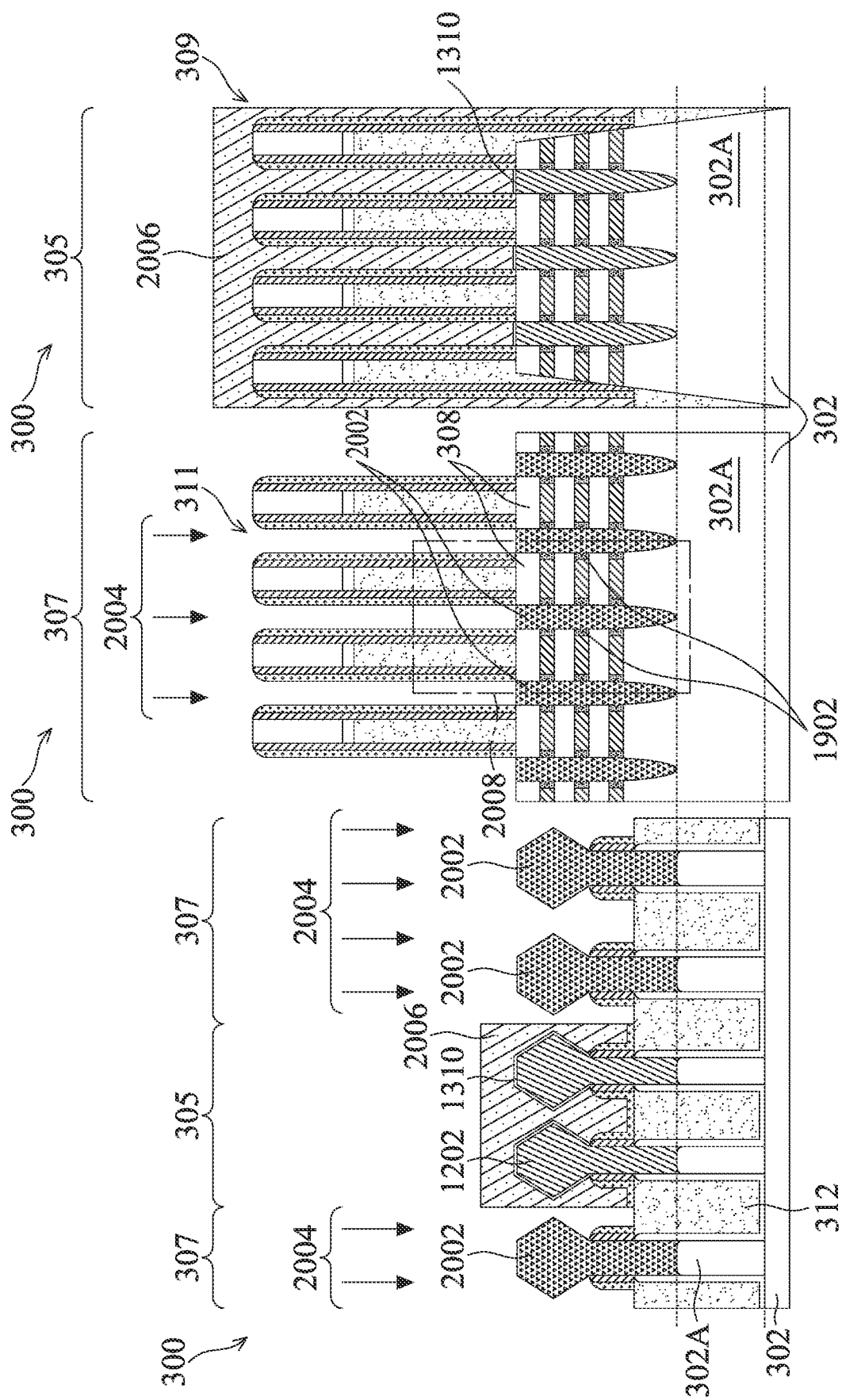

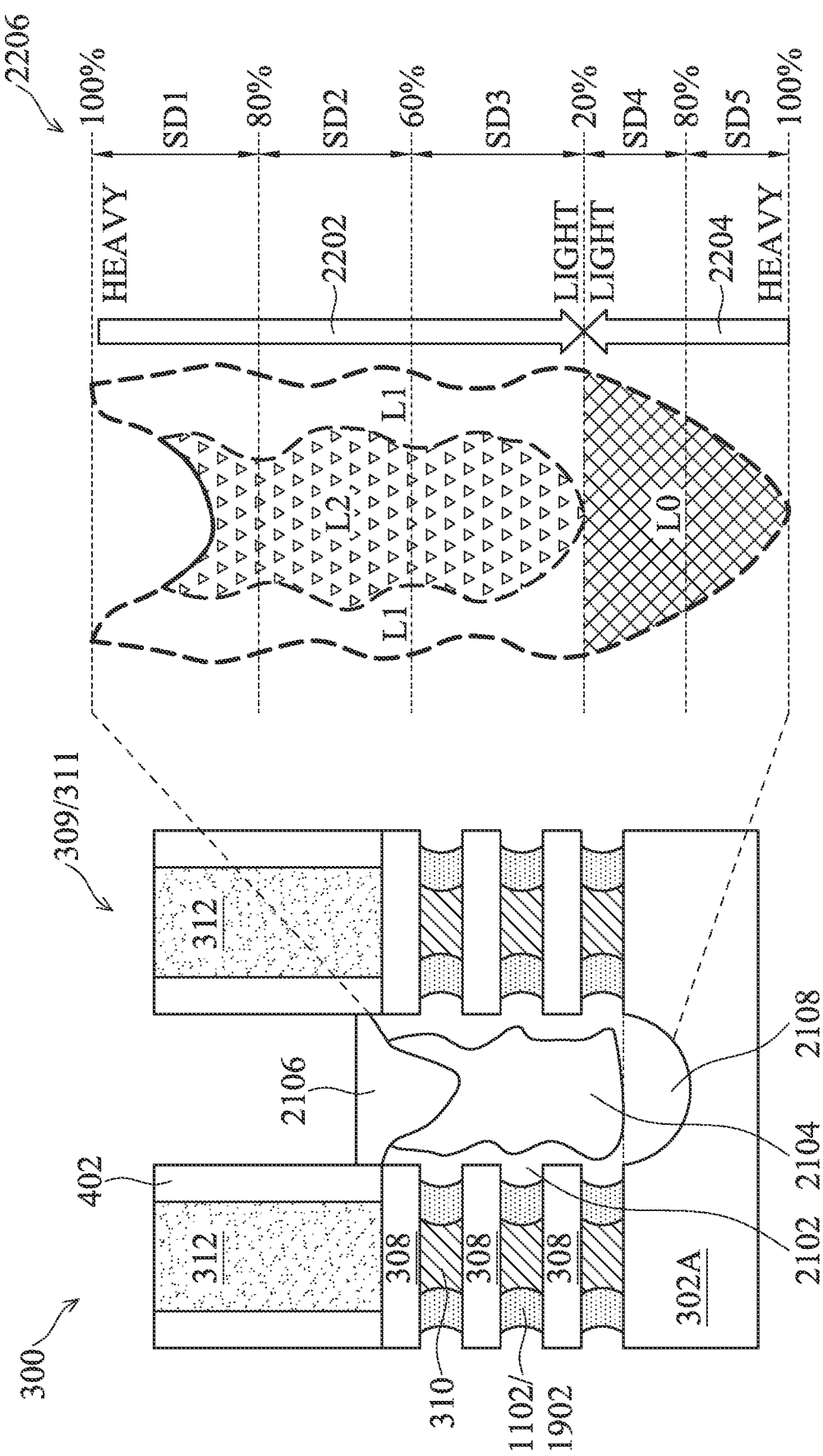

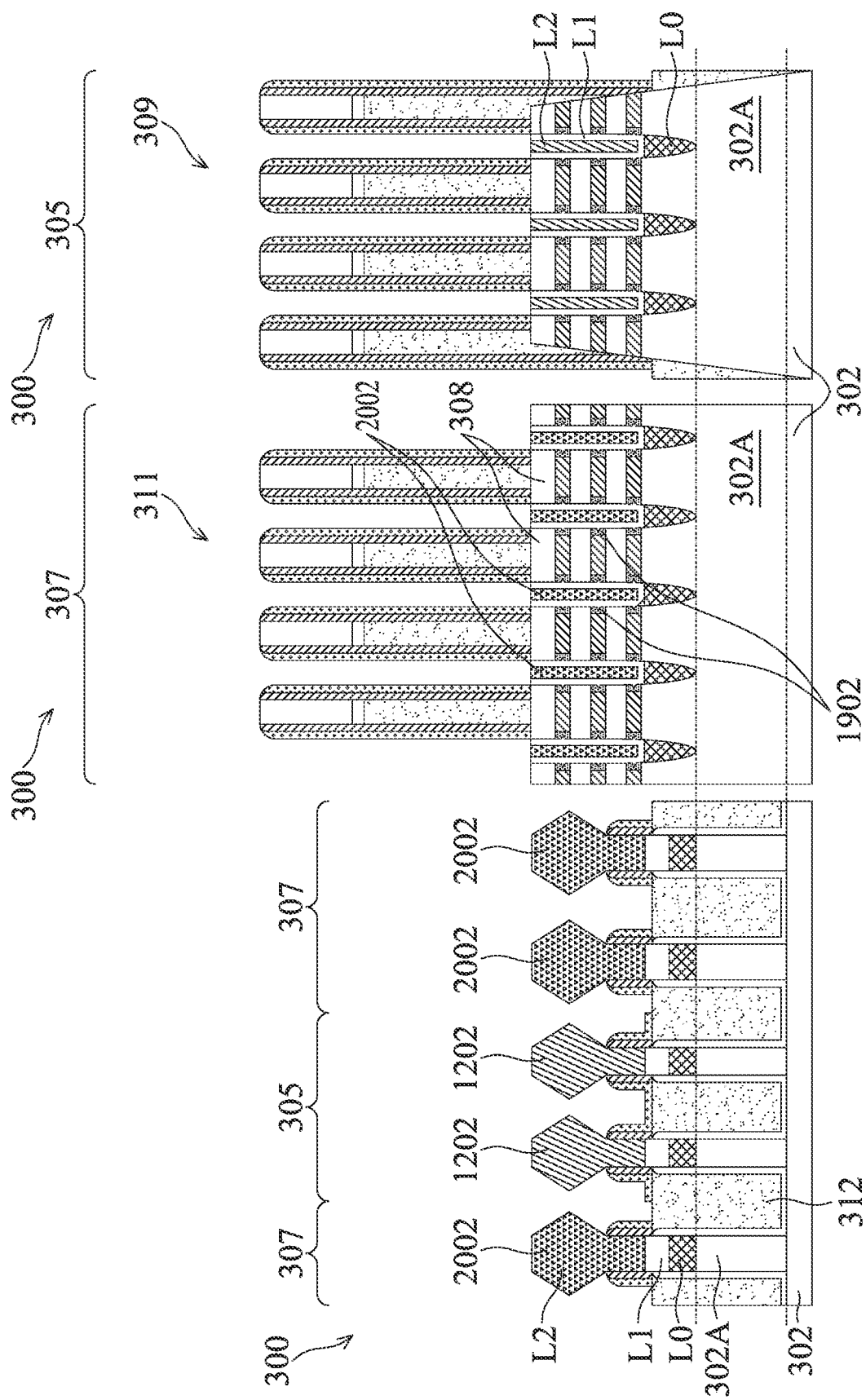

MULTI-GATE DEVICE AND RELATED METHODS

CROSS-REFERENCE TO RELATED APPLICATIONS

This application is a divisional of U.S. patent application Ser. No. 17/319,794, filed May 13, 2021, the disclosure of which is herein incorporated by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, despite having many desirable features, GAA transistor fabrication has continued to face challenges as a result of the ongoing scaling down of semiconductor IC dimensions.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, and 23A provide cross-sectional views of an embodiment of the semiconductor device 300 along a plane substantially parallel to a plane defined by section BB' of FIG. 1, in accordance with some embodiments;

FIGS. 3B/3C, 4B/4C, 5B/5C, 6B/6C, 7B/7C, 8B/8C, 9B/9C, 10B/10C, 11B/11C, 12B/12C, 13B/13C, 14B/14C, 15B/15C, 16B/16C, 17B/17C, 18B/18C, 19B/19C, 20B/20C, and 23B/23C provide cross-sectional views of an embodiment of the semiconductor device 300 along a plane substantially parallel to a plane defined by section AA' of FIG. 1, according to some embodiments;

FIG. 21 provides a view of a section of FIG. 12C and FIG. 20B, in accordance with some embodiments;

FIG. 22 provides a zoomed-in view of a portion of the device 300 of FIG. 21, according to some embodiments.

DETAILED DESCRIPTION

Figure 1:
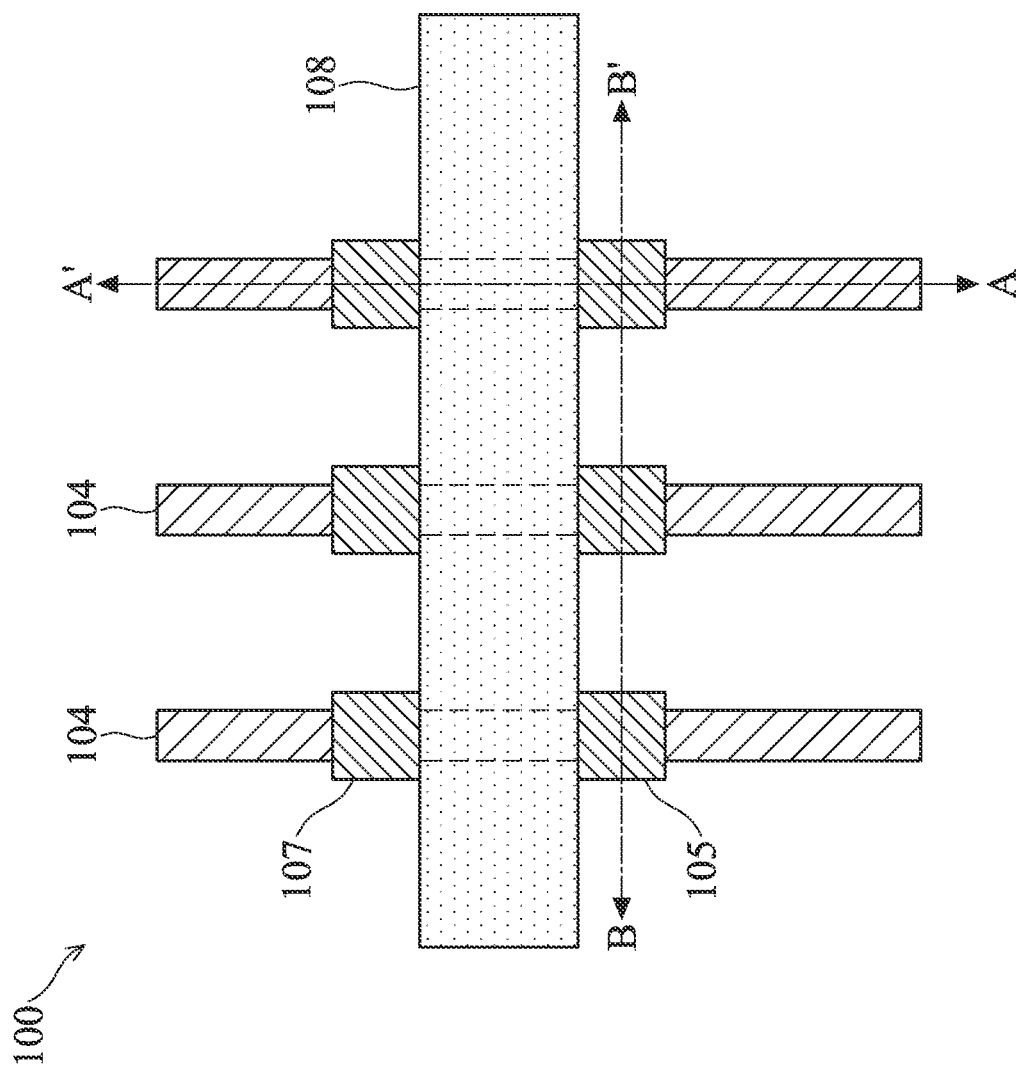
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

In various examples, GAA source/drain features may be formed using multiple layers which may include multiple epitaxially grown layers. In some cases, a first source/drain layer may include a lower-doped layer to prevent out-diffusion and/or suppress leakage current, and a second source/drain layer may include a higher-doped layer to reduce source/drain contact resistance. However, in some cases, suboptimal doping of either of the first source/drain layer or the second source/drain layer may cause various issues. For example, such suboptimal doping may degrade GAA device short-channel control and result in high sub-threshold leakage, junction leakage, and increased parasitic capacitance. Moreover, when such GAA devices are used to form static random-access memory (SRAM) devices, such suboptimal doping may result in unbalanced pass-gate (PG)/pull-up (PU) threshold voltages (Vt) and a suboptimal alpha ratio (PU Idsat/PG Idsat), both of which are vital for providing a desired SRAM cell operation margin. More generally, and for highly-scaled SRAM devices, GAA device performance is critical to speed and power consumption of SRAM cell operation.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having improved source/drain features. In some embodiments, after forming a source/drain epitaxial feature, one or more dopant implant processes are performed to dope the source/drain epitaxial feature. In various examples, the one or more dopant implant processes are configured to provide a dopant gradient within the implanted source/drain epitaxial feature. In some cases, each of the epitaxial layers used to form the source/drain epitaxial feature may themselves also include a dopant gradient within the respective epitaxial layer. The dopant gradient may, in some embodiments, be defined along a vertical direction (e.g., in a direction perpendicular to a substrate top surface). For instance, a doping concentration of a particular epitaxial layer may increase or decrease along the vertical direction. In some embodiments, a first source/drain layer may be doped (e.g., by ion implantation) with carbon (C), where a concentration of the C dopant is greatest (e.g., heaviest) at the bottom of the first source/drain layer, and where the concentration of the C dopant decreases to a lowest (e.g., lightest) concentration at the top of the first source/drain layer. In some embodiments, the C dopant may be used to suppress bottom source/drain leakage and prevent dopant out-diffusion. A second source/drain layer may also be doped (e.g., by ion implantation) with a phosphorous (P) or boron (B) implant, depending on a device type, where a concentration of the P or B dopant is greatest (e.g., heaviest) at the top of the second source/drain layer, and where the concentration of the P or B dopant decreases to a lowest (e.g., lightest) concentration at the bottom of the second source/drain layer adjacent to the top of the first source/drain layer. In some embodiments, the low doping concentration of the P or B dopant at the bottom of the second source/drain layer may be used to suppress bottom source/drain leakage, and the high doping concentration of the P or B dopant at the top of the second source/drain layer may be used to improve contact resistance. In some cases, for example when GAA transistors are used to fabricate SRAM devices, the second source/drain layer may be doped with P for pass-gate (PG) or pull-down (PD) devices, and the second source/drain layer may be doped with B for pull-up (PU) devices. In some embodiments, the C implantation of the first source/drain layer may be used for each of the PG, PD, and PU devices. In accordance with the embodiments disclosed herein, the disclosed dopant gradient within the source/drain epitaxial features provides for GAA transistors having improved source/drain features, which in turn provides for SRAM devices having improved short-channel control, lower sub-threshold leakage, improved SRAM cell yield, and improved operation margin. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
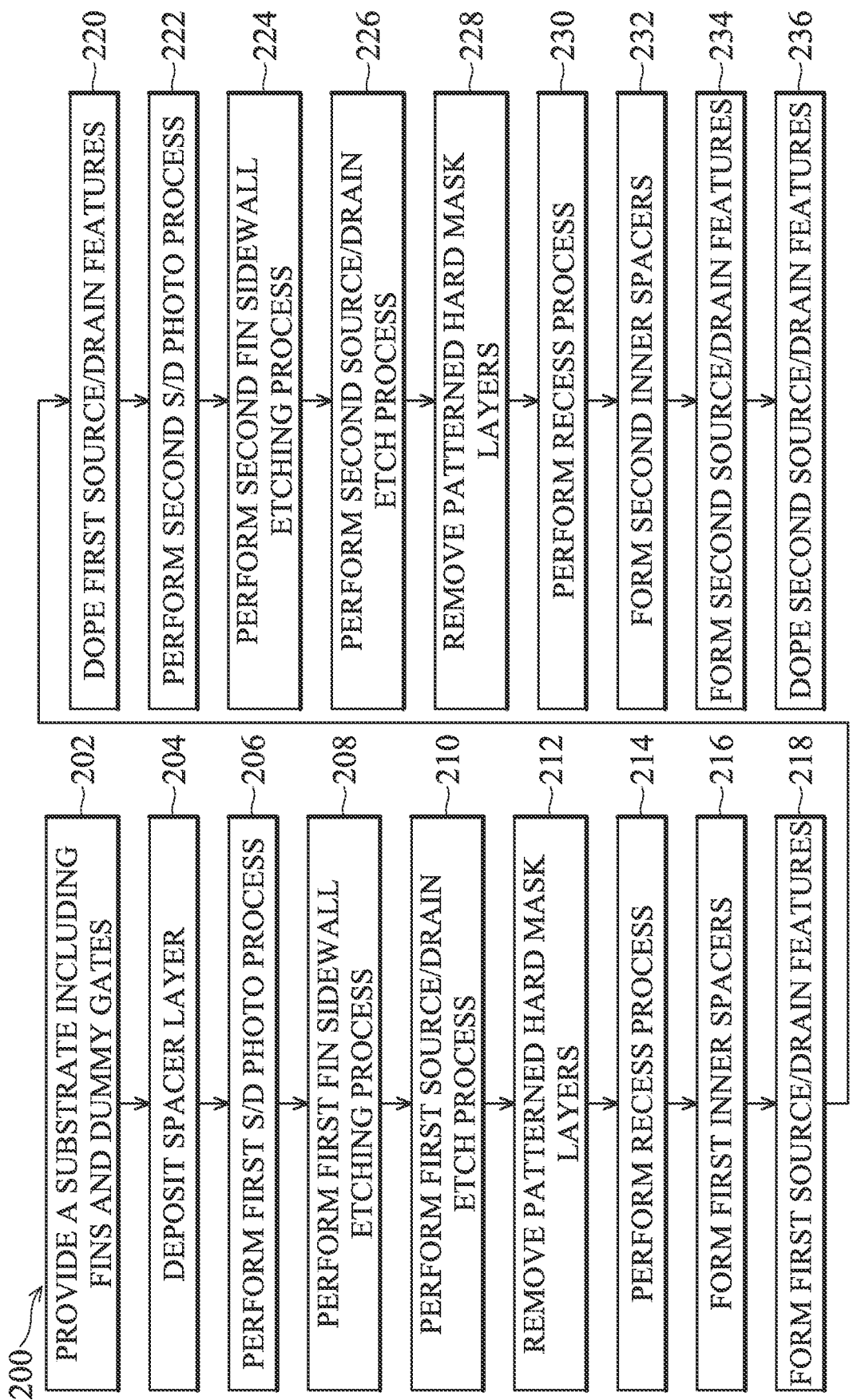
FIG. 2 is a flow chart of a method of fabricating a semiconductor device 300, according to one or more aspects of the present disclosure.

Referring to FIG. 2, illustrated therein is a method 200 of semiconductor fabrication including fabrication of a semiconductor device 300 (e.g., which includes a multi-gate device) having improved source/drain features, in accordance with various embodiments. The method 200 is discussed below with reference to fabrication of GAA transistors which may be used to implement SRAM devices. However, it will be understood that aspects of the method 200 may be equally applied to other types of multi-gate devices, or to other types of devices implemented by the multi-gate devices such as core (logic) devices, analog devices, or other types of devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

In addition, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 includes a plurality of semiconductor devices (e.g., transistors), including P-type transistors, N-type transistors, etc., which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including fins and dummy gates is provided. Referring to the example of FIGS. 3A/3B/3C, in an embodiment of block 202, a substrate 302 including fins 304 and dummy gate stacks 309, 311 is provided. FIG. 3A provides a cross-sectional view of an embodiment of the semiconductor device 300 along a plane substantially parallel to a plane defined by section BB' of FIG. 1 which traverses a source/drain region of the device 300. FIG. 3A also illustrates a P-type device region 305 and an N-type device region 307. In some embodiments, the P-type device region 305 includes an SRAM P-type device region, and the N-type device region 307 includes an SRAM N-type device region. FIGS. 3B and 3C provide cross-sectional views of an embodiment of the semiconductor device 300 along a plane substantially parallel to a plane defined by section AA' of FIG. 1. In addition, FIG. 3B illustrates the N-type device region 307, and FIG. 3C illustrates the P-type device region 305. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The fins 304, which include layers 308 and 310, may be formed by growing epitaxial layers of a first composition (e.g., which are subsequently patterned to form the layers 310) interposed by epitaxial layers of a second composition (e.g., which are subsequently patterned to form the layers 308). In an embodiment, the epitaxial layers of the first composition (e.g., used to form layers 310) are SiGe and the epitaxial layers of the second composition (e.g., used to form layers 308) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 308, 310 are shown as having a particular stacking sequence within the fins 304, where the layer 308 is the topmost layer of the stack of layers 308, 310, other configurations are possible. For example, in some cases, the layer 310 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

The fins 304 may be fabricated using suitable processes including photolithography and etch processes. The photolithography process may include forming a photoresist layer over the device 300, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302, and layers formed thereupon, while a wet and/or dry etch process forms trenches in unprotected regions through the epitaxial layers of the first composition and the second composition, and into the substrate 302, thereby leaving the plurality of extending fins 304.

In various embodiments, each of the fins 304 includes a substrate portion 302A formed from the substrate 302, the layers 310 (e.g., including the first composition), and the layers 308 (e.g., including the second composition). In some examples, the epitaxial layers 308 (e.g., including the second composition), or portions thereof, may form a channel region of a GAA transistor of the device 300. For example, the layers 308 may be referred to as semiconductor channel layers that are used to form a channel region of a GAA transistor. In various embodiments, the semiconductor channel layers (e.g., the layers 308 or portions thereof) may include nanosheet channel(s), nanowire channel(s), bar-shaped channel(s), and/or other suitable channel configurations.

It is noted that while the fins 304 are illustrated as including three (3) layers of the epitaxial layer 310 and three (3) layers of the epitaxial layer 308, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some examples, the number of epitaxial layers, and thus the number of semiconductor channel layers, is selected based on the device type being implemented by the GAA transistor (e.g., such as core (logic) devices, SRAM devices, or analog devices, among others). In some embodiments, the number of epitaxial layers 308, and thus the number of semiconductor channel layers, is between 3 and 10.

In some embodiments, the epitaxial layers 310 each have a thickness range of about 4-8 nanometers (nm). In some cases, the epitaxial layers 308 each have a thickness range of about 4-8 nm. As noted above, the epitaxial layers 308 may serve as channel region(s) for a subsequently-formed multi-gate device (e.g., a GAA transistor) and its thickness may be chosen based at least in part on device performance considerations. The epitaxial layers 310 may serve to define a gap distance between adjacent channel region(s) for the subsequently-formed multi-gate device and its thickness may also be chosen based at least in part on device performance considerations.

In a further embodiment of block 202, and still with reference to FIGS. 3A/3B/3C, recessed shallow trench isolation (STI) features 312 are formed interposing the fins 304. In some examples, after forming the fins 304, the trenches interposing the fins 304 may be filled with a dielectric material. In some embodiments, the dielectric material used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

After depositing the dielectric material, a CMP process may be performed to remove excess portions of the dielectric material and to planarize a top surface of the device 300, and an STI recess process (e.g., including a wet and/or dry etch process) is performed to recess the dielectric material between the fins 304 and form recessed STI features 312. In various examples, the fins 304 extend above the recessed STI features 312 such that the epitaxial stack of layers 308, 310 of each of the fins 304 is exposed.

In a further embodiment of block 202, and still referring to FIGS. 3A/3B/3C, dummy gates are formed. While the present discussion is directed to a replacement gate (gate-last) process whereby a dummy gate structure is formed and subsequently replaced, other configurations may be possible. In some embodiments, gate stacks 309, 311 are formed over the fins 304 of the semiconductor device 300. In an embodiment, the gate stacks 309, 311 are dummy (sacrificial) gate stacks that are subsequently removed and replaced by the final gate stack at a subsequent processing stage of the device 300, as discussed below. The gate stacks 309, 311 may be replaced at a later processing stage by a high-K dielectric layer (HK) and metal gate electrode (MG). In some embodiments, the gate stacks 309, 311 are formed over the substrate 302 and are at least partially disposed over the fins 304 of the semiconductor device 300. The portion of the fins 304 underlying the gate stacks 309, 311 may be referred to as the channel region. The gate stacks 309, 311 may also define a source/drain region of the fins 304, for example, as the regions of the fins 304 adjacent to and on opposing sides of the channel region. In some embodiments, sidewall spacers may also be formed on sidewalls of the gate stacks 309, 311, as discussed below.

In some embodiments, the gate stacks 309, 311 include a dielectric layer and an electrode layer 312 over the dielectric layer. The gate stacks 309, 311 may also include one or more hard mask layers 314, 316. In some embodiments, the hard mask layer 314 may include a nitride layer, and the hard mask layer 316 may include an oxide layer. In some embodiments, the gate stacks 309, 311 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 309, 311 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer of the gate stacks 309, 311 includes silicon oxide. Alternatively, or additionally, the dielectric layer may include silicon nitride, a high-K dielectric material or other suitable material. In some embodiments, the electrode layer 312 may include polycrystalline silicon (polysilicon). In some embodiments, the nitride of the hard mask layer 314 includes a pad nitride layer that may include $Si_3N_4$, silicon oxynitride or silicon carbide. In some embodiments, the oxide of the hard mask layer 316 includes a pad oxide layer that may include $SiO_2$.

The method then proceeds to block 204 where a spacer layer is deposited. In particular, the spacer layer may be deposited after formation of the gate stacks 309, 311. Referring to the example of FIGS. 4A/4B/4C, in an embodiment of block 204, a spacer layer 402 is deposited over the device 300. FIG. 4A provides a cross-sectional view of an embodiment of the device 300 along a plane substantially parallel to a plane defined by section BB' of FIG. 1 (traversing the source/drain region of the device 300), and FIGS. 4B/4C provide cross-sectional views of an embodiment of the device 300 along a plane substantially parallel to a plane defined by section AA' of FIG. 1. FIGS. 4A/4B/4C also illustrate the N-type device region 307 and the P-type device region 305, discussed above, showing that the spacer layer 402 may be deposited over both the N-type device region 307 and the P-type device region 305. In some embodiments, the spacer layer 402 may be a conformal layer. The spacer layer 402 may be deposited over and on sidewalls of the gate stacks 309, 311, as well as over and on sidewalls of the fins 304. In some cases, the spacer layer 402 may have a thickness of about 2-10 nm. In some examples, the spacer layer 402 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the spacer layer 402 includes multiple layers, such as a spacer layer 402A and a spacer layer 402B formed over the spacer layer 402A, which may include main spacer layers, liner layers, and the like. By way of example, the spacer layer 402 may be formed by conformally depositing a dielectric material over the device 300 using processes such as a CVD process, a subatmospheric CVD (SACVD) process, a flowable CVD process, an ALD process, a PVD process, or other suitable process.

The method 200 then proceeds to block 206 where a first source/drain photolithography (photo) process is performed. Referring to the example of FIGS. 5A/5B/5C, in an embodiment of block 206, the first source/drain photo process is performed, where the first source/drain process may include a P-type region source/drain photo process. FIG. 5A provides a cross-sectional view of an embodiment of the device 300 along a plane substantially parallel to a plane defined by section BB' of FIG. 1 (traversing the source/drain region of the device 300), and FIGS. 5B/5C provide cross-sectional views of an embodiment of the device 300 along a plane substantially parallel to a plane defined by section AA' of FIG. 1. As part of the first source/drain photo process of block 206, a first hard mask (HM) layer 502 may be deposited over the device 300, a second HM layer 504 may be deposited over the first HM layer 502, and a photoresist layer 506 may be formed over the second HM layer 504. The first HM layer 502 and the second HM layer 504 may each include a silicon nitride layer such as $Si_3N_4$, silicon oxynitride or silicon carbide. The first HM layer 502 and the second HM layer 504 may be deposited by CVD, PVD, ALD, or by another suitable process. In some embodiments, the first HM layer 502 may include a bottom contact etch stop layer (B-CESL) and the second HM layer 504 may include a middle contact etch stop layer (M-CESL). In various examples, the photoresist layer 506 may be deposited (e.g., by spin-coating) over the second HM layer 504. After forming the photoresist layer 506, the photoresist layer 506 may be exposed and developed to pattern the photoresist layer 506. In some embodiments, the patterning of the photoresist layer 506 removes portions of the photoresist layer 506 from the P-type device region 305, while portions of the photoresist layer 506 in the N-type device region 307 remain intact. In various embodiments, after patterning the photoresist layer 506, an etching process (e.g., such as a dry etch, wet etch, or combination thereof) may be performed to etch the first HM layer 502 and the second HM layer 504 within the P-type device region 305, using the patterned photoresist layer 506 as a mask, to form trenches 508. As shown, the trenches 508 expose the spacer layer 402 over both the fins 304 and the gate stacks 309 within the P-type device region 305. After forming the trenches 508, and in some embodiments, the patterned photoresist layer 506 may be removed, for example, by way of a solvent, resist stripper, ashing, or other suitable technique. However, the patterned first HM layer 502 and the patterned second HM layer 504 remain disposed over the N-type device region 307.

The method 200 then proceeds to block 208 where a first fin sidewall etching process is performed. Referring to the example of FIGS. 6A/6B/6C, in an embodiment of block 208, the first fin sidewall etching process is performed within regions (P-type device regions) exposed by the trenches 508 formed at block 206. FIG. 6A provides a cross-sectional view of an embodiment of the device 300 along a plane substantially parallel to a plane defined by section BB' of FIG. 1 (traversing the source/drain region of the device 300), and FIGS. 6B/6C provide cross-sectional views of an embodiment of the device 300 along a plane substantially parallel to a plane defined by section AA' of FIG. 1. In some embodiments, the first fin sidewall etching process may include a wet etching process, a dry etching process, or a combination thereof. In some cases, the first fin sidewall etching process serves to remove portions of the spacer layer 402 (including the spacer layers 402A/402B) from over the fins 304 and from over portions of the sidewalls of the fins 304, within the P-type device region 305, thus exposing the epitaxial stack of layers 308, 310 of the fins 304 in source/drain regions of the P-type device region 305 (FIG. 6A). In some embodiments, the first fin sidewall etching process may also remove portions of the spacer layer 402 (including the spacer layers 402A/402B) from top surfaces of the gate stacks 309 and from top surfaces of the epitaxial stack of layers 308, 310 between adjacent gate stacks 309 (e.g., in source/drain regions) within the P-type device region 305 (FIG. 6C). Thus, the first fin sidewall etching process may serve to expose the epitaxial stack of layers 308, 310 within source/drain regions of the P-type device region 305, while the N-type device region 307 remains protected by the patterned first HM layer 502 and the patterned second HM layer 504. In some embodiments, the first fin sidewall etching process may also at least partially etch the second HM layer 504, thereby reducing a thickness of the second HM layer 504.

The method 200 then proceeds to block 210 where a first source/drain etch process is performed. With reference to FIGS. 7A/7B/7C, in an embodiment of block 210, a first source/drain etch process is performed to etch the exposed epitaxial stack of layers 308, 310 within source/drain regions of the P-type device region 305. FIG. 7A provides a cross-sectional view of an embodiment of the device 300 along a plane substantially parallel to a plane defined by section BB' of FIG. 1 (traversing the source/drain region of the device 300), and FIGS. 7B/7C provide cross-sectional views of an embodiment of the device 300 along a plane substantially parallel to a plane defined by section AA' of FIG. 1. In some embodiments, the first source/drain etch process is performed to remove the exposed epitaxial layers 308, 310 in source/drain regions of the P-type device region 305 to form trenches 702 which expose underlying substrate portions 302A of the fins 304 in the P-type device region 305 while the N-type device region 307 remains masked by the patterned first HM layer 502 and the patterned second HM layer 504. By way of example, the first source/drain etch process may serve to remove portions of the epitaxial layers 308, 310 (in source/drain regions of the P-type device region 305) that were exposed during the first fin sidewall etching process of block 208, described above. In some embodiments, the first source/drain etch process may include a dry etching process, a wet etching process, and/or a combination thereof.

The method 200 then proceeds to block 212 where first and second patterned hard mask layers are removed. With reference to FIGS. 8A/8B/8C, in an embodiment of block 212, the patterned first HM layer 502 and the patterned second HM layer 504 (which were disposed over the N-type device region 307) are removed. FIG. 8A provides a cross-sectional view of an embodiment of the device 300 along a plane substantially parallel to a plane defined by section BB' of FIG. 1 (traversing the source/drain region of the device 300), and FIGS. 8B/8C provide cross-sectional views of an embodiment of the device 300 along a plane substantially parallel to a plane defined by section AA' of FIG. 1. In some examples, the patterned first HM layer 502 and the patterned second HM layer 504 are removed after the first source/drain etch process of block 210. In various embodiments, the patterned first HM layer 502 and the patterned second HM layer 504 may be removed using a wet etching process, a dry etching process, or a combination thereof.

The method 200 then proceeds to block 214 where a recess process is performed. With reference to FIGS. 9A/9B/9C, in an embodiment of block 214, a recess process is performed within the trenches 702. FIG. 9A provides a cross-sectional view of an embodiment of the device 300 along a plane substantially parallel to a plane defined by section BB' of FIG. 1 (traversing the source/drain region of the device 300), and FIGS. 9B/9C provide cross-sectional views of an embodiment of the device 300 along a plane substantially parallel to a plane defined by section AA' of FIG. 1. In various examples, the recess process of block 214 includes a lateral etch of the epitaxial layers 310 (SiGe layers) to form recesses 902 along sidewalls of the trenches 702. Due to the difference in etch selectivity between the epitaxial layers 310 (SiGe) and the epitaxial layers 308 (Si), the lateral etch of the epitaxial layers 310 may be performed without simultaneously etching the epitaxial layers 308. In some embodiments, the lateral etch of the epitaxial layers 310 may be performed using a wet etching process, a dry etching process, or a combination thereof. In some embodiments, the recesses 902 may be disposed beneath sidewall spacers of the gate stacks 309. In some cases, the recesses may extend further such that they are also disposed at least partially beneath the electrode layer 312 of the gate stacks 309. In various examples, the recesses 902 generally define a region within which inner spacers are subsequently formed, as described below.

Figures 10A, 10B, 10C:
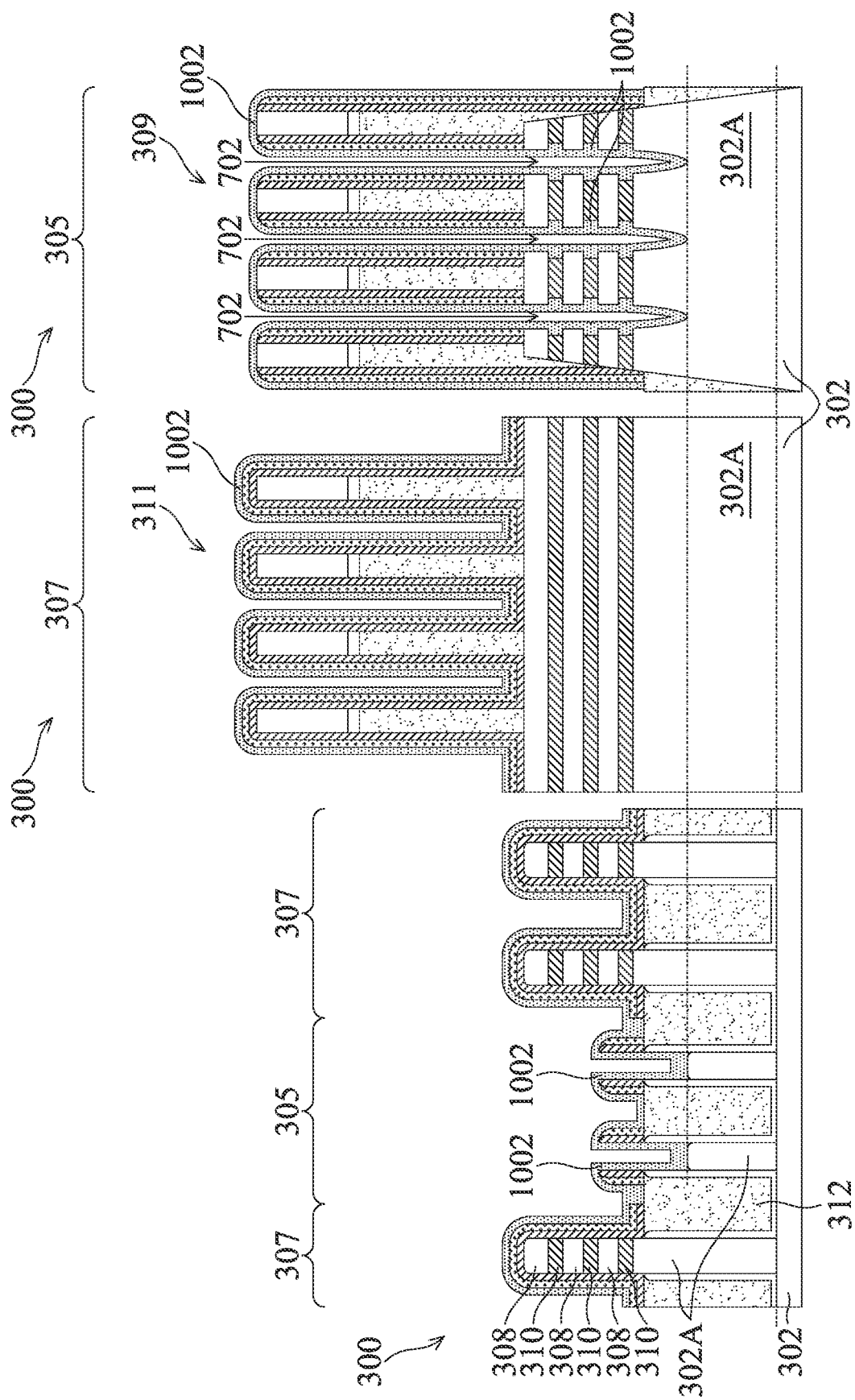
Figures 11A, 11B, 11C:
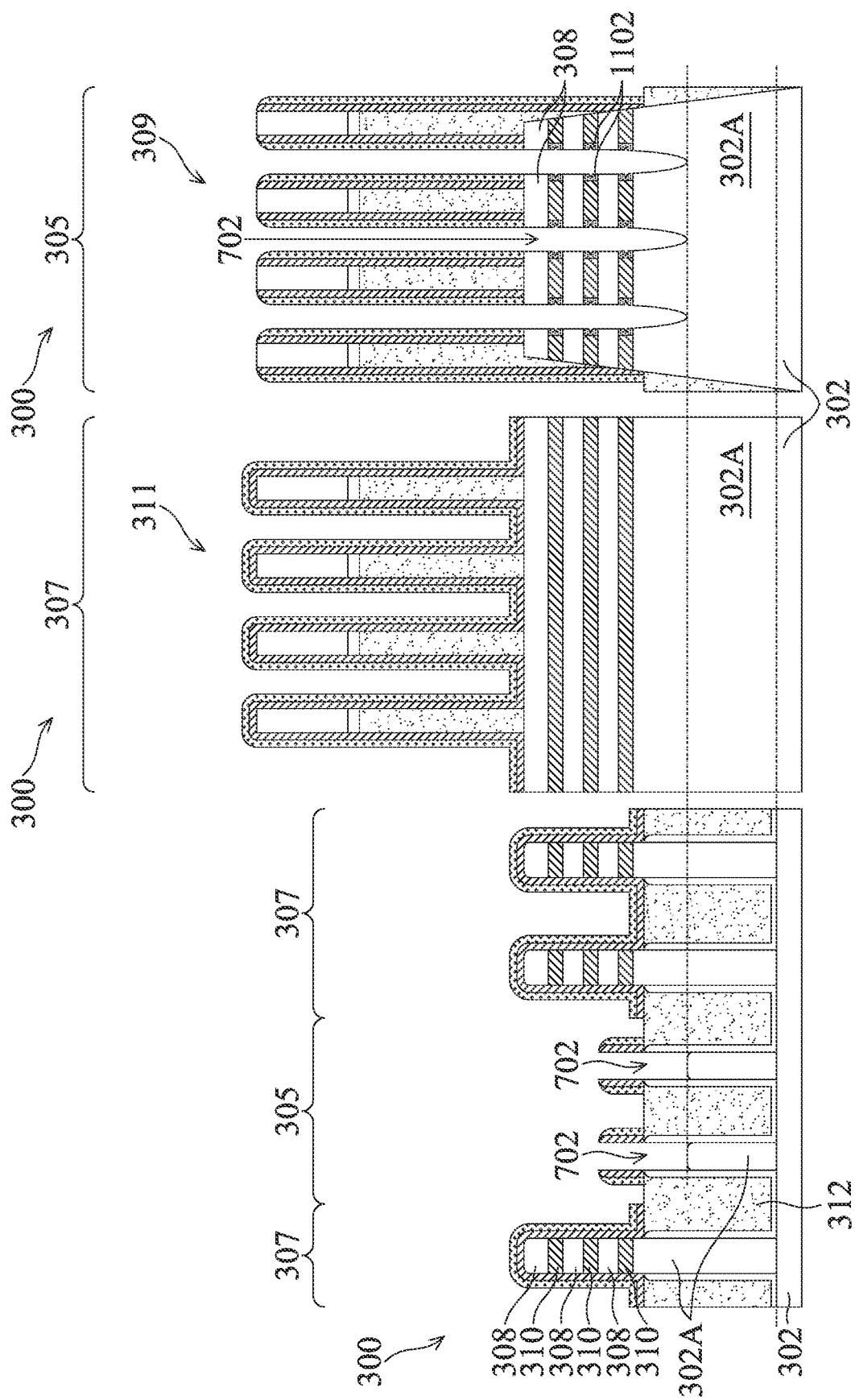

The method 200 then proceeds to block 216 where first inner spacers are formed. Referring to the example of FIGS. 10A/10B/10C and FIGS. 11A/11B/11C, in an embodiment of block 216, first inner spacers are formed in the P-type device region 305 of the device 300. FIGS. 10A and 11A provide cross-sectional views of an embodiment of the device 300 along a plane substantially parallel to a plane defined by section BB' of FIG. 1 (traversing the source/drain region of the device 300), and FIGS. 10B/10C and 11B/11C provide cross-sectional views of an embodiment of the device 300 along a plane substantially parallel to a plane defined by section AA' of FIG. 1. In some embodiments, an inner spacer material layer 1002 is first deposited over the device 300 including over both the N-type device region 307 and the P-type device region 305. In some embodiments, the inner spacer material layer 1002 may be deposited conformally over the device 300, including within the recesses 902 and along sidewalls of the trenches 702 within the P-type device region 305. In some examples, the inner spacer material layer 1002 may include a dielectric material such as SiCNx. More generally, and in various examples, the inner spacer material layer 1002 may include silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the inner spacer material layer 1002 may include amorphous silicon. By way of example, the inner spacer material layer 1002 may be formed by conformally depositing a dielectric material over the device 300 using processes such as a CVD process, an SACVD process, a flowable CVD process, an ALD process, a PVD process, or other suitable process.

After deposition of the inner spacer material layer 1002, and in a further embodiment of block 216, an etch-back process may be performed. In some embodiments, the etch-back process substantially removes the inner spacer material layer 1002 from the device 300, except for portions of the inner spacer material layer 1002 that remain disposed within the recesses 902 after the etch-back process and which define inner spacers 1102 for the P-type device region 305. In various examples, the inner spacers 1102 may extend beneath sidewall spacers of the gate stacks 309, and optionally at least partially beneath the electrode layer 312 of the gate stacks 309 (e.g., depending on the size of the recesses 902), while abutting subsequently formed source/drain features, described below.

Figures 12A, 12B, 12C:
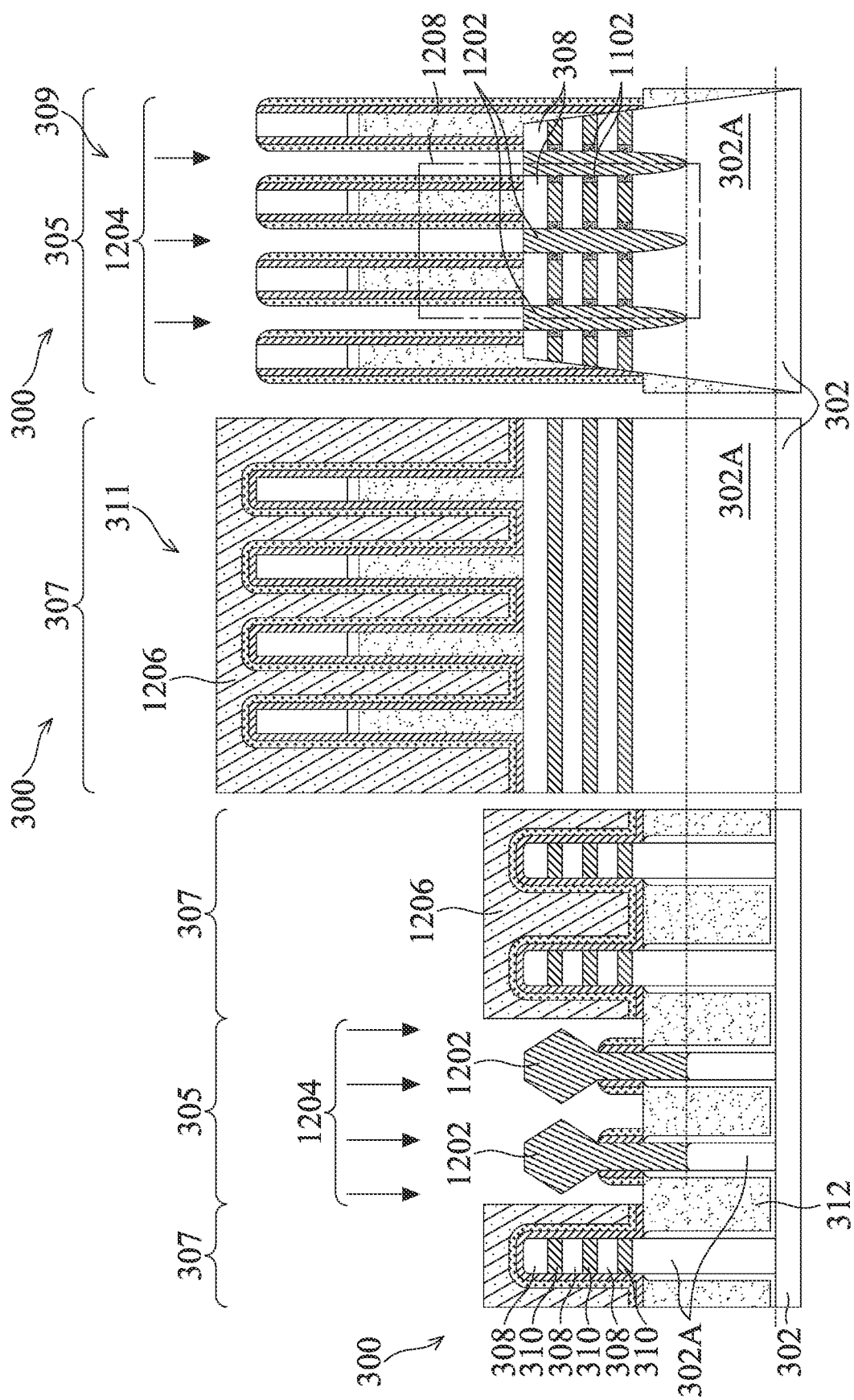

The method 200 then proceeds to block 218 where first source/drain features are formed. With reference to FIGS. 12A/12B/12C, in an embodiment of block 218, source/drain features 1202 are formed in the P-type device region 305 of the semiconductor device 300. FIG. 12A provides a cross-sectional view of an embodiment of the device 300 along a plane substantially parallel to a plane defined by section BB' of FIG. 1 (traversing the source/drain region of the device 300), and FIGS. 12B/12C provide cross-sectional views of an embodiment of the device 300 along a plane substantially parallel to a plane defined by section AA' of FIG. 1. In some embodiments, the source/drain features 1202 are formed in source/drain regions adjacent to and on either side of the gate stacks 309 in the P-type device region 305. For example, the source/drain features 1202 may be formed within the trenches 702 of the P-type device region 305. In some embodiments, the source/drain features 1202 are formed by epitaxially growing one or more semiconductor material layers in the source/drain regions. In general, the one or more semiconductor material layers grown to form source/drain features for the device 300 may include Ge, Si, GaAs, AlGaAs, SiGe, GaAsP, SiP, SiB, SiGeBx, SiAs, SiPAsx, SiC, SiCP, or other suitable material. In various embodiments, the source/drain features 1202 abut the inner spacers 1102 and the epitaxial layers 308 (e.g., the channel layers of the GAA transistor).

The method 200 proceeds to block 220, where the first source/drain features are doped. Still referring to the example of FIGS. 12A/12B/12C, in an embodiment of block 220, the first source/drain features 1202 are doped using one or more implantation processes 1204 to provide a dopant gradient within the source/drain features 1202. In some embodiments, as part of the doping process of block 220 and prior to performing the one or more implantation processes 1204, a patterned hard mask (HM) layer 1206 is formed over the device 300. In some embodiments, the patterned HM layer 1206 includes a silicon nitride layer such as $Si_3N_4$, silicon oxynitride or silicon carbide, and may be deposited by CVD, PVD, ALD, or by another suitable process. As shown, an opening in the patterned HM layer 1206 exposes the source/drain features 1202 within the P-type device region 305, while the N-type device region 307 remains covered by the patterned HM layer 1206.

After forming the patterned HM layer 1206, the one or more implantation processes 1204 may be performed to dope the source/drain features 1202. The implantation 1204 performed into the source/drain features 1202 may include a P-type dopant implant, thereby providing P-type source/drain features. By way of example, and in some embodiments, the P-type source/drain features (e.g., the source/drain features 1202) formed within the P-type device region 305 may include SiGe or a boron-doped epitaxial layer such as SiB or SiGeBx. In at least some examples, the source/drain features 1202 may be formed using multiple epitaxially grown layers. For instance, in some embodiments, a first source/drain layer of the source/drain features 1202 may include a graded C-doped layer used to suppress bottom source/drain leakage current and prevent dopant out-diffusion. In some embodiments, a second source/drain layer of the source/drain features 1202 may include a lower portion and an upper portion. By way of example, the lower portion of the second source/drain layer may include a lower-doped layer (e.g., such as lightly boron-doped SiGe for the P-type source/drain features 1202) to prevent out-diffusion and/or suppress leakage current, and the upper portion of the second source/drain layer may include a higher-doped layer (e.g., heavily boron-doped SiGe) to reduce source/drain contact resistance. Thus, the upper portion and the lower portion of the second source/drain layer also collectively define a graded dopant layer (e.g., a graded B-doped layer). It is noted that while the doping of the source/drain features 1202 is described as being performing using the one or more implantation processes 1204, in some embodiments, the source/drain features 1202 may additionally be in-situ doped (e.g., during the epi growth process). In various embodiments, and after doping the source/drain features 1202, the patterned HM layer 1206 may be removed (e.g., using a wet etching process, a dry etching process, or a combination thereof).

To provide further detail regarding the graded doping profile of the multiple epitaxially grown layers used to form the source/drain features (e.g., such as the source/drain feature 1202), reference is made to FIGS. 21 and 22. The example of FIG. 21 generally provides a view of a section 1208 of FIG. 12C, showing the gate stacks 309 including the electrode layer 312 and sidewall spacer layers 402 on sidewalls of the gate stacks 309. FIG. 21 also illustrates the epitaxial layers 308, 310, the inner spacers 1102, a source/drain layer 2102, a source/drain layer 2104, and a silicide layer 2106. In various examples, the source/drain layer 2102 may be referred to as layer "L1", and the source/drain layer 2104 may be referred to as layer "L2". In some embodiments, a source/drain layer 2108, which may be referred to as layer "L0", may include a separate epitaxial layer formed prior to the source/drain layer 2102 (layer "L1") and the source/drain layer 2104. In some embodiments, the layer L0 may include a graded C-doped layer (e.g., such as SiC) used to suppress bottom source/drain leakage current and prevent dopant out-diffusion. In some cases, a lower region of the layers L1 and L2 (e.g., proximate to the layer L0) may include a lower-doped layer (e.g., such as lightly boron-doped SiGe for the P-type source/drain features 1202) to prevent out-diffusion and/or suppress leakage current, and an upper region of the layers L1 and L2 may include a higher-doped layer (e.g., heavily boron-doped SiGe) to reduce source/drain contact resistance. Thus, the upper region and the lower region of the layers L1 and L2 may collectively define graded dopant layers (e.g., graded B-doped layers). Additional discussion regarding the layers "L0", "L1", and "L2" is provided below with reference to FIGS. 23A/23B/23C.

It is noted that in the example of FIG. 21, the source/drain layer 2102 illustrates an alternative embodiment including an irregular profile of the source/drain layer 2102 that generally follows the contours of the sidewall surface collectively defined by the epitaxial layers 308 and the inner spacers 1102. As shown, and in some examples, a portion of the source/drain layer 2104 that interfaces the source/drain layer 2102 may substantially follow the irregular profile of the source/drain layer 2102. Stated another way, in some embodiments, both the source/drain layer 2102 and the source/drain layer 2104 may have the irregular profile.

With reference now to FIG. 22, illustrated therein is a zoomed-in view of a portion of the device 300 of FIG. 21. In particular, the portion illustrated in FIG. 22 includes the source/drain feature (e.g., such as the source/drain feature 1202) of the device 300, the source/drain feature including the layers L0, L1, and L2, discussed above. In some embodiments, each of the layers L0, L1, and L2 used to form the source/drain feature may include a dopant gradient. By way of example, the dopant gradient may be defined along a vertical direction (e.g., in a direction perpendicular to a substrate top surface). For example, as shown in FIG. 22, a doping concentration of phosphorous (P) or boron (B) implanted into the layers L1 and L2 may be greatest at the top of the layers L1, L2, with the dopant concentration decreasing along the vertical direction toward the bottom of the layers L1, L2, as indicated by arrow 2202 which points from a 'Heavy' concentration to a 'Light' concentration. Likewise, as also shown in FIG. 22, a doping concentration of carbon (C) implanted into the layer L0 may be greatest at the bottom of the layer L0, with the dopant concentration decreasing along the vertical direction toward the top of the layer L0, as indicated by arrow 2204. In some embodiments, the C dopant in the layer L0 may be used to suppress bottom source/drain leakage and prevent dopant out-diffusion. In some embodiments, the low doping concentration of the P or B dopant at the bottom of the layers L1, L2 may be used to suppress bottom source/drain leakage, and the high doping concentration of the P or B dopant at the top of the layers L1, L2 may be used to improve contact resistance.

In some cases, for example when GAA transistors are used to fabricate SRAM devices, the layers L1, L2 may be doped with P (or arsenic, As, in some cases) for pass-gate (PG) or pull-down (PD) devices (e.g., which may be N-type devices), and the layers L1, L2 may be doped with B for pull-up (PU) devices (e.g., which may be P-type devices). Thus, in various embodiments, the layers L1, L2 may include a boron-doped epitaxial layer such as SiB or SiGeBx for the PU devices (P-type devices), and the layers L1, L2 may include SiP or an arsenic-doped epitaxial layer such as SiAs or SiPAsx for PG or PD devices (N-type devices). In some embodiments, the C implantation of the layer L0 may be used for each of the PG, PD, and PU devices. As such, in some cases, the layer L0 may include a SiC layer. Further, in at least some embodiments, the layer L0 may include boron-doped SiGe (for P-type devices) or SiP (for N-type devices).

Elaborating on the dopant gradient within each of the layers L0, L1, L2, reference is made to the ion implantation dose distribution 2206. By way of example, the percentages shown in the dose distribution may represent a fraction of a total dose of a given dopant as a function of vertical position within the source/drain epitaxial feature (e.g., such as the source/drain feature 1202). For purposes of this discussion, the source/drain epitaxial feature illustrated in the example of FIG. 22 is broken up into regions 'SD1', 'SD2', 'SD3', 'SD4', and SD5', along the vertical direction of the source/drain feature. As shown, the percentages are provided at top and bottom boundaries of each of the regions SD1, SD2, SD3, SD4, SD5, representing a change (gradient) in the fraction of the total dose of a given dopant from one boundary (e.g., top/bottom) to the other boundary (e.g., top/bottom) of the given region SD1, SD2, SD3, SD4, SD5.

For example, within the region SD1, the fraction of the total dose of P (for PG and PD N-type devices) or the fraction of the total dose of B (for PU P-type devices), may decrease from about 100% total dose at the top of the region SD1 to about 80% total dose at the bottom of the region SD1. Within the region SD2, the fraction of the total dose of P (for PG and PD N-type devices) or the fraction of the total dose of B (for PU P-type devices), may decrease from about 80% total dose at the top of the region SD2 to about 60% total dose at the bottom of the region SD2. Within the region SD3, the fraction of the total dose of P (for PG and PD N-type devices) or the fraction of the total dose of B (for PU P-type devices), may decrease from about 60% total dose at the top of the region SD3 to about 20% total dose at the bottom of the region SD3. As another example, within the region SD5, the fraction of the total dose of C (for PG, PD N-type devices or for PU P-type devices), may decrease from about 100% total dose at the bottom of the region SD5 to about 80% total dose at the top of the region SD5, and within the region SD4, the fraction of the total dose of C (for PG, PD N-type devices or for PU P-type devices), may decrease from about 80% total dose at the bottom of the region SD4 to about 20% total dose at the top of the region SD4. It is noted that in various examples, the gradient defined within the source/drain epitaxial feature, and thus the gradient defined within each of the regions SD1, SD2, SD3, SD4, SD5, may include a linear gradient, a non-linear gradient, a step gradient (which may include one or more steps in total dose or dopant concentration of a given dopant), or a combination thereof. In some embodiments, a dopant concentration within the layer L1 (e.g., P or B) may be in a range of between about $5\text{-}10 \times 10^{20}$ atoms/cm$^3$, a dopant concentration with the layer L2 (e.g., P or B) may be in a range of between about $1\text{-}5\times10^{21}$ atoms/cm$^3$, and a dopant concentration with the layer L0 (e.g., C) may be in a range of between about $1\text{-}5\times10^{19}$ atoms/cm$^3$. In accordance with the embodiments disclosed herein, the disclosed dopant gradient within the source/drain epitaxial features provides for GAA transistors having improved source/drain features, which in turn provides for SRAM devices having improved short-channel control, lower sub-threshold leakage, improved SRAM cell yield, and improved operation margin.

Figures 13A, 13B, 13C:
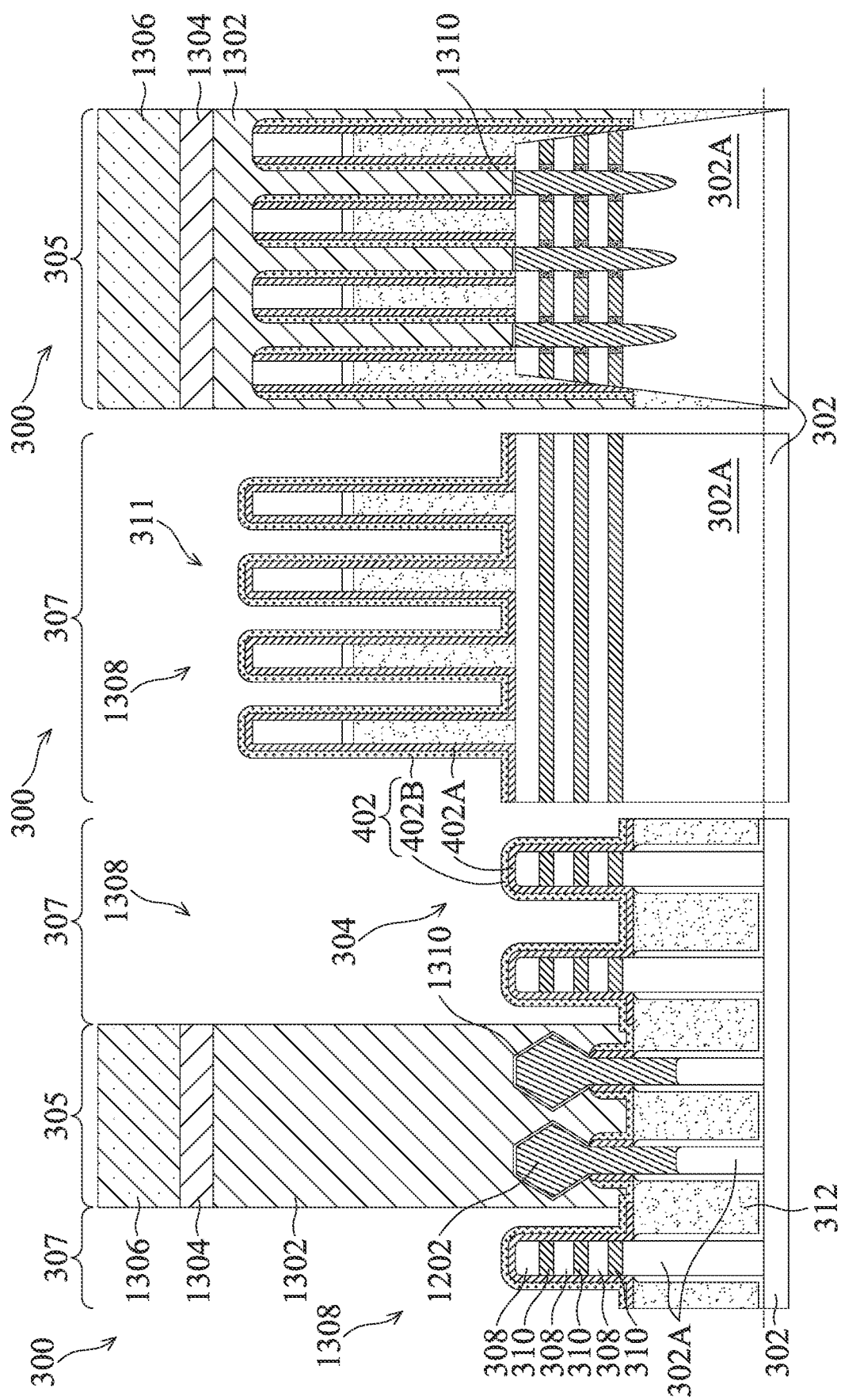

After doping the first source/drain features, as discussed above, and removing the patterned HM layer 1206, the method 200 then proceeds to block 222 where a second source/drain photolithography (photo) process is performed. Referring to the example of FIGS. 13A/13B/13C, in an embodiment of block 222, the second source/drain photo process is performed, where the second source/drain process may include an N-type region source/drain photo process. FIG. 13A provides a cross-sectional view of an embodiment of the device 300 along a plane substantially parallel to a plane defined by section BB' of FIG. 1 (traversing the source/drain region of the device 300), and FIGS. 13B/13C provide cross-sectional views of an embodiment of the device 300 along a plane substantially parallel to a plane defined by section AA' of FIG. 1. As part of the second source/drain photo process of block 222, a first hard mask (HM) layer 1302 may be deposited over the device 300, a second HM layer 1304 may be deposited over the first HM layer 1302, and a photoresist layer 1306 may be formed over the second HM layer 1304. The first HM layer 1302 and the second HM layer 1304 may each include a silicon nitride layer such as Si$_3$N$_4$, silicon oxynitride or silicon carbide. The first HM layer 1302 and the second HM layer 1304 may be deposited by CVD, PVD, ALD, or by another suitable process. In some embodiments, the first HM layer 1302 may include a bottom contact etch stop layer (B-CESL) and the second HM layer 1304 may include a middle contact etch stop layer (M-CESL). In various examples, the photoresist layer 1306 may be deposited (e.g., by spin-coating) over the second HM layer 1304. After forming the photoresist layer 1306, the photoresist layer 1306 may be exposed and developed to pattern the photoresist layer 1306. In some embodiments, the patterning of the photoresist layer 1306 removes portions of the photoresist layer 1306 from the N-type device region 307, while portions of the photoresist layer 1306 in the P-type device region 305 remain intact. In various embodiments, after patterning the photoresist layer 1306, an etching process (e.g., such as a dry etch, wet etch, or combination thereof) may be performed to etch the first HM layer 1302 and the second HM layer 1304 within the N-type device region 307, using the patterned photoresist layer 1306 as a mask, to form trenches 1308. As shown, the trenches 1308 expose the spacer layer 402 over both the fins 304 and the gate stacks 311 within the N-type device region 307. After forming the trenches 1308, and in some embodiments, the patterned photoresist layer 1306 may be removed, for example, by way of a solvent, resist stripper, ashing, or other suitable technique. However, the patterned first HM layer 1302 and the patterned second HM layer 1304 remain disposed over the P-type device region 305. It is noted that in some embodiments, and prior to forming the first HM layer 1302, a nitride layer 1310 (e.g., such as SiNx) may be formed over the P-type source/drain features 1202 to protect the P-type source/drain features 1202 from oxidation. In various cases, the nitride layer 1310 may be removed after formation of N-type source/drain features, as discussed below.

Figures 14A, 14B, 14C:
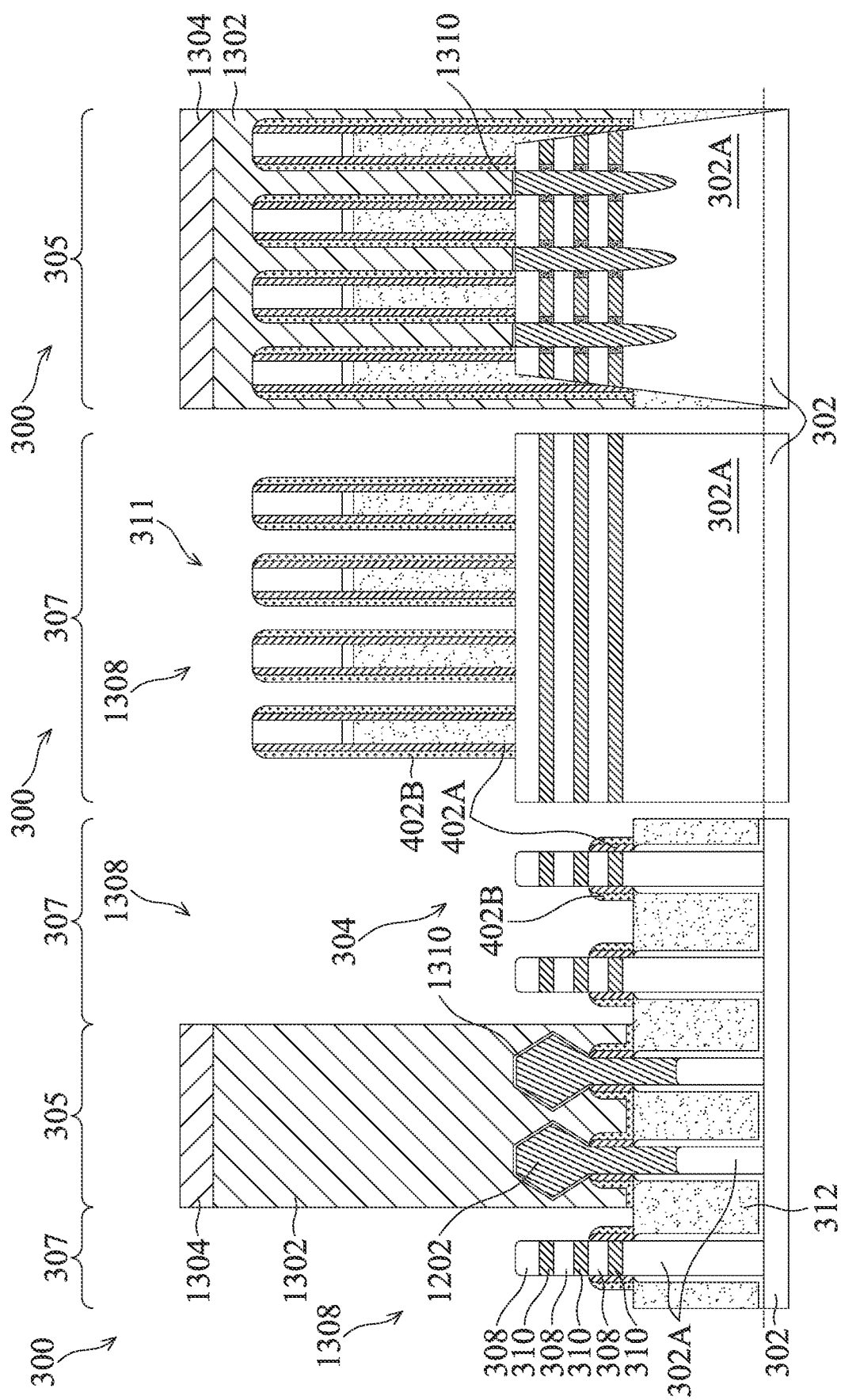

The method 200 then proceeds to block 224 where a second fin sidewall etching process is performed. Referring to the example of FIGS. 14A/14B/14C, in an embodiment of block 224, the second fin sidewall etching process is performed within regions (N-type device regions) exposed by the trenches 1308 formed at block 222. FIG. 14A provides a cross-sectional view of an embodiment of the device 300 along a plane substantially parallel to a plane defined by section BB' of FIG. 1 (traversing the source/drain region of the device 300), and FIGS. 14B/14C provide cross-sectional views of an embodiment of the device 300 along a plane substantially parallel to a plane defined by section AA' of FIG. 1. In some embodiments, the second fin sidewall etching process may include a wet etching process, a dry etching process, or a combination thereof. In some cases, the second fin sidewall etching process serves to remove portions of the spacer layer 402 (including the spacer layers 402A/402B) from over the fins 304 and from over portions of the sidewalls of the fins 304, within the N-type device region 307, thus exposing the epitaxial stack of layers 308, 310 of the fins 304 in source/drain regions of the N-type device region 307 (FIG. 14A). In some embodiments, the second fin sidewall etching process may also remove portions of the spacer layer 402 (including the spacer layers 402A/402B) from top surfaces of the gate stacks 311 and from top surfaces of the epitaxial stack of layers 308, 310 between adjacent gate stacks 311 (e.g., in source/drain regions) within the N-type device region 307 (FIG. 14B). Thus, the second fin sidewall etching process may serve to expose the epitaxial stack of layers 308, 310 within source/drain regions of the N-type device region 307, while the P-type device region 305 (and the previously formed P-type source/drain features 1202) remains protected by the patterned first HM layer 1302 and the patterned second HM layer 1304. In some embodiments, the second fin sidewall etching process may also at least partially etch the second HM layer 1304, thereby reducing a thickness of the second HM layer 1304.

Figures 15A, 15B, 15C:
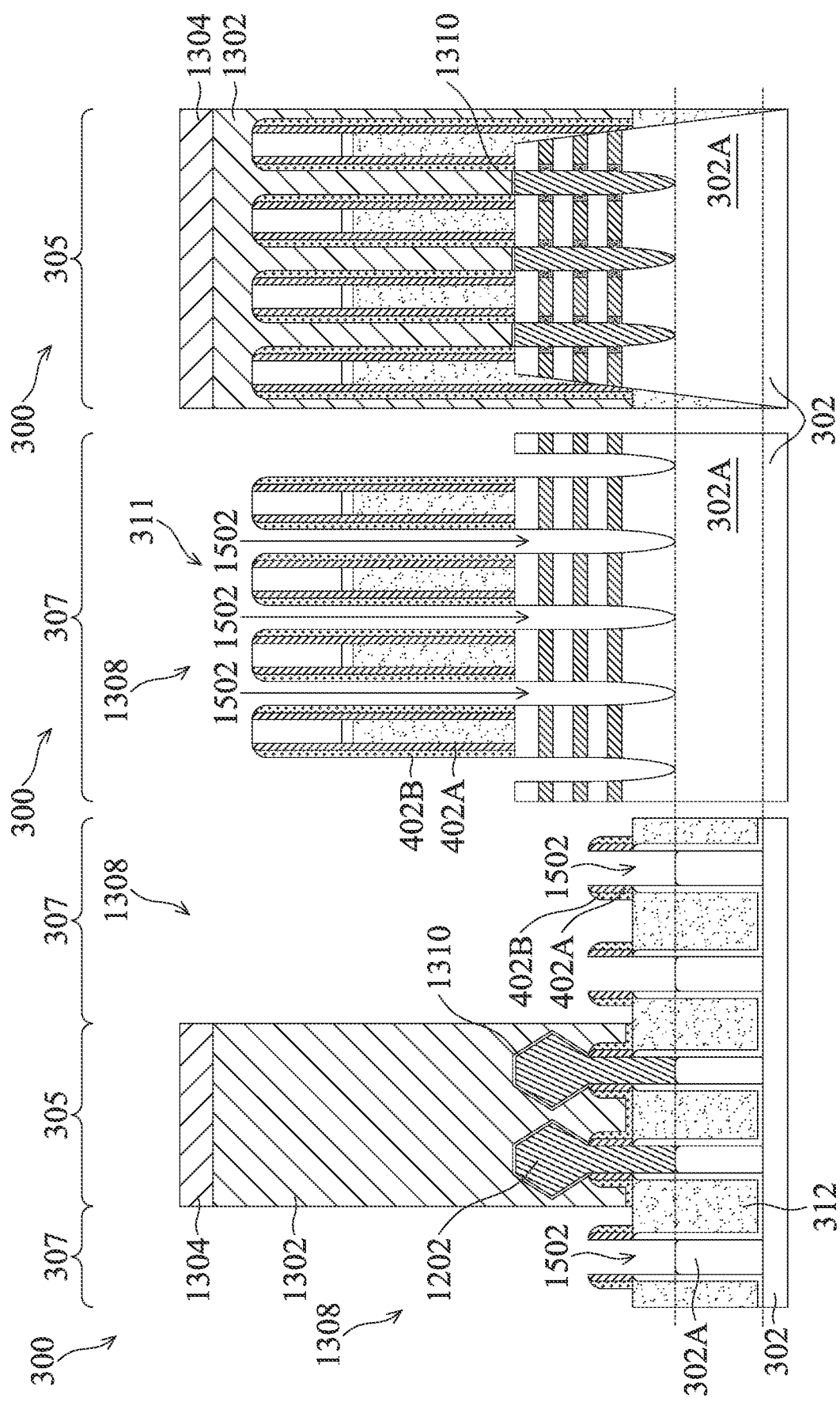

The method 200 then proceeds to block 226 where a second source/drain etch process is performed. With reference to FIGS. 15A/15B/15C, in an embodiment of block 226, a second source/drain etch process is performed to etch the exposed epitaxial stack of layers 308, 310 within source/drain regions of the N-type device region 307. FIG. 15A provides a cross-sectional view of an embodiment of the device 300 along a plane substantially parallel to a plane defined by section BB' of FIG. 1 (traversing the source/drain region of the device 300), and FIGS. 15B/15C provide cross-sectional views of an embodiment of the device 300 along a plane substantially parallel to a plane defined by section AA' of FIG. 1. In some embodiments, the second source/drain etch process is performed to remove the exposed epitaxial layers 308, 310 in source/drain regions of the N-type device region 307 to form trenches 1502 which expose underlying substrate portions 302A of the fins 304 in the N-type device region 307 while the P-type device region 305 remains masked by the patterned first HM layer 1302 and the patterned second HM layer 1304. By way of example, the second source/drain etch process may serve to remove portions of the epitaxial layers 308, 310 (in source/drain regions of the N-type device region 307) that were exposed during the second fin sidewall etching process of block 224, described above. In some embodiments, the second source/drain etch process may include a dry etching process, a wet etching process, and/or a combination thereof.

Figures 16A, 16B, 16C:
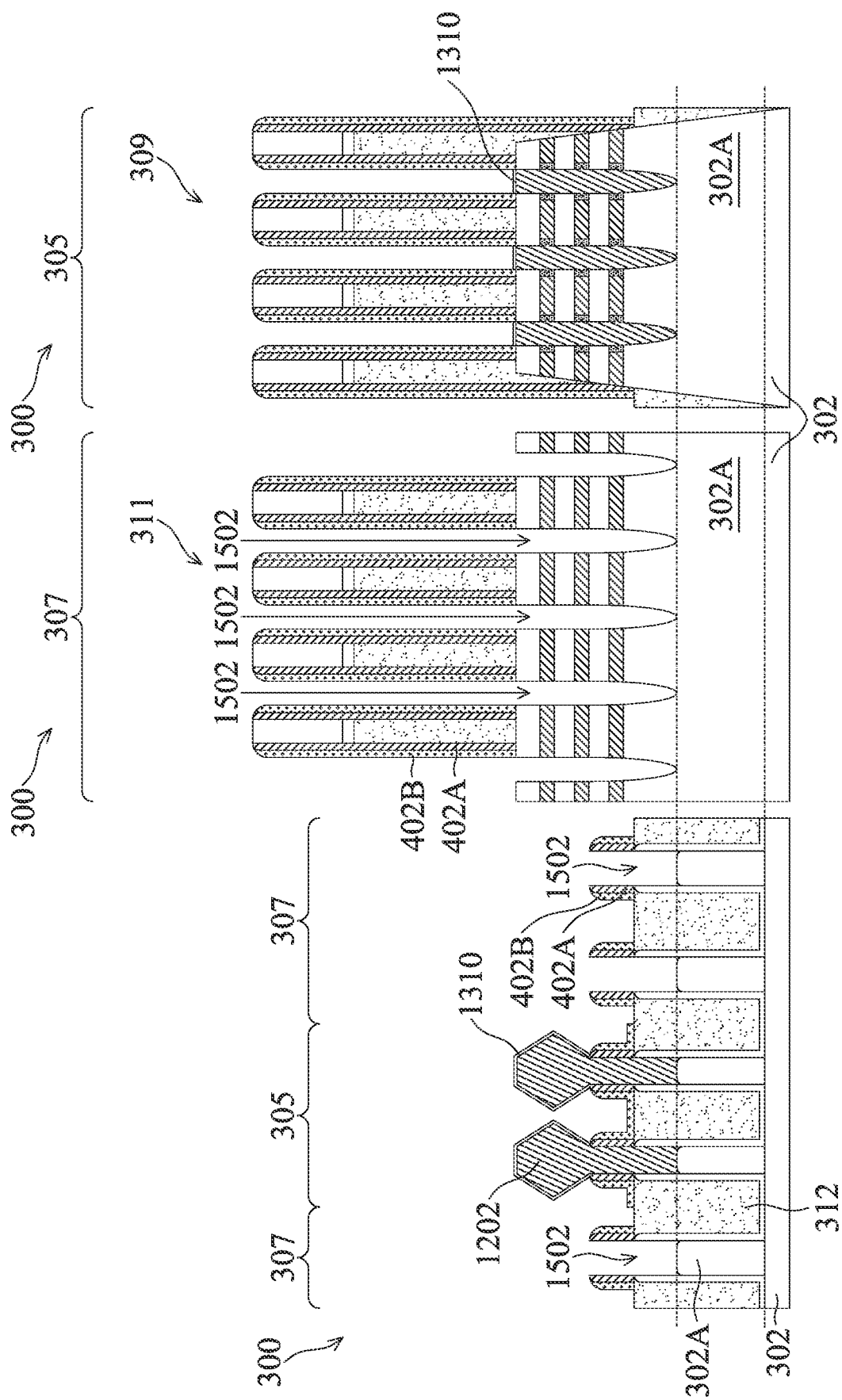

The method 200 then proceeds to block 228 where first and second patterned hard mask layers are removed. With reference to FIGS. 16A/16B/16C, in an embodiment of block 228, the patterned first HM layer 1302 and the patterned second HM layer 1304 (which were disposed over the P-type device region 305) are removed. FIG. 16A provides a cross-sectional view of an embodiment of the device 300 along a plane substantially parallel to a plane defined by section BB' of FIG. 1 (traversing the source/drain region of the device 300), and FIGS. 16B/16C provide cross-sectional views of an embodiment of the device 300 along a plane substantially parallel to a plane defined by section AA' of FIG. 1. In some examples, the patterned first HM layer 1302 and the patterned second HM layer 1304 are removed after the second source/drain etch process of block 226. In various embodiments, the patterned first HM layer 1302 and the patterned second HM layer 1304 may be removed using a wet etching process, a dry etching process, or a combination thereof. In some embodiments, after the patterned first HM layer 1302 and the patterned second HM layer 1304 are removed, the nitride layer 1310 still remains disposed over the P-type source/drain features 1202 to protect the P-type source/drain features 1202 during subsequent processing of the device 300.

Figures 17A, 17B, 17C:
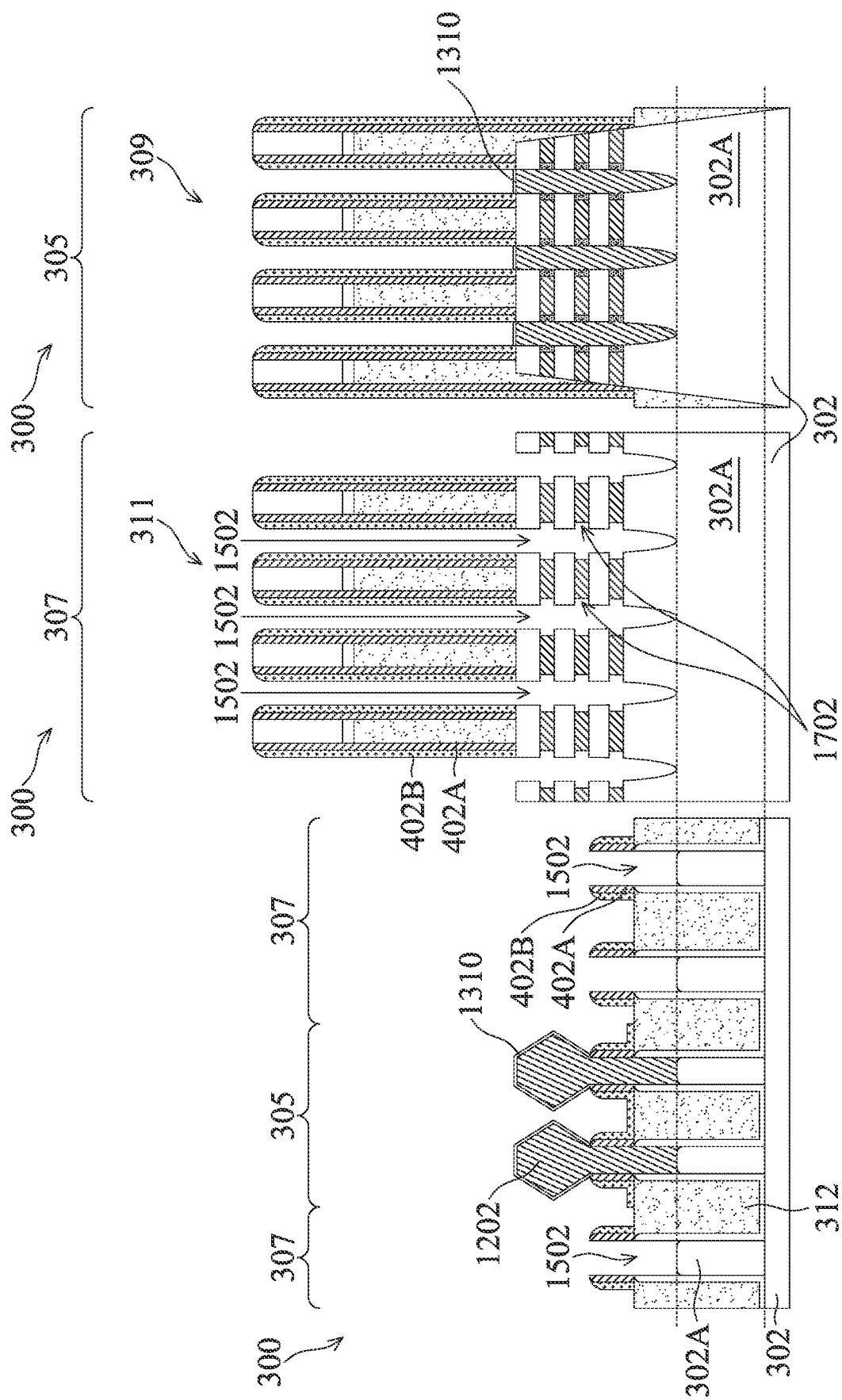

The method 200 then proceeds to block 230 where a recess process is performed. With reference to FIGS. 17A/17B/17C, in an embodiment of block 230, a recess process is performed within the trenches 1502. FIG. 17A provides a cross-sectional view of an embodiment of the device 300 along a plane substantially parallel to a plane defined by section BB' of FIG. 1 (traversing the source/drain region of the device 300), and FIGS. 17B/17C provide cross-sectional views of an embodiment of the device 300 along a plane substantially parallel to a plane defined by section AA' of FIG. 1. In various examples, the recess process of block 230 includes a lateral etch of the epitaxial layers 310 (SiGe layers) to form recesses 1702 along sidewalls of the trenches 1502. Due to the difference in etch selectivity between the epitaxial layers 310 (SiGe) and the epitaxial layers 308 (Si), the lateral etch of the epitaxial layers 310 may be performed without simultaneously etching the epitaxial layers 308. In some embodiments, the lateral etch of the epitaxial layers 310 may be performed using a wet etching process, a dry etching process, or a combination thereof. In some embodiments, the recesses 1702 may be disposed beneath sidewall spacers of the gate stacks 311. In some cases, the recesses may extend further such that they are also disposed at least partially beneath the electrode layer 312 of the gate stacks 311. In various examples, the recesses 1702 generally define a region within which inner spacers are subsequently formed, as described below.

Figures 18A, 18B, 18C:
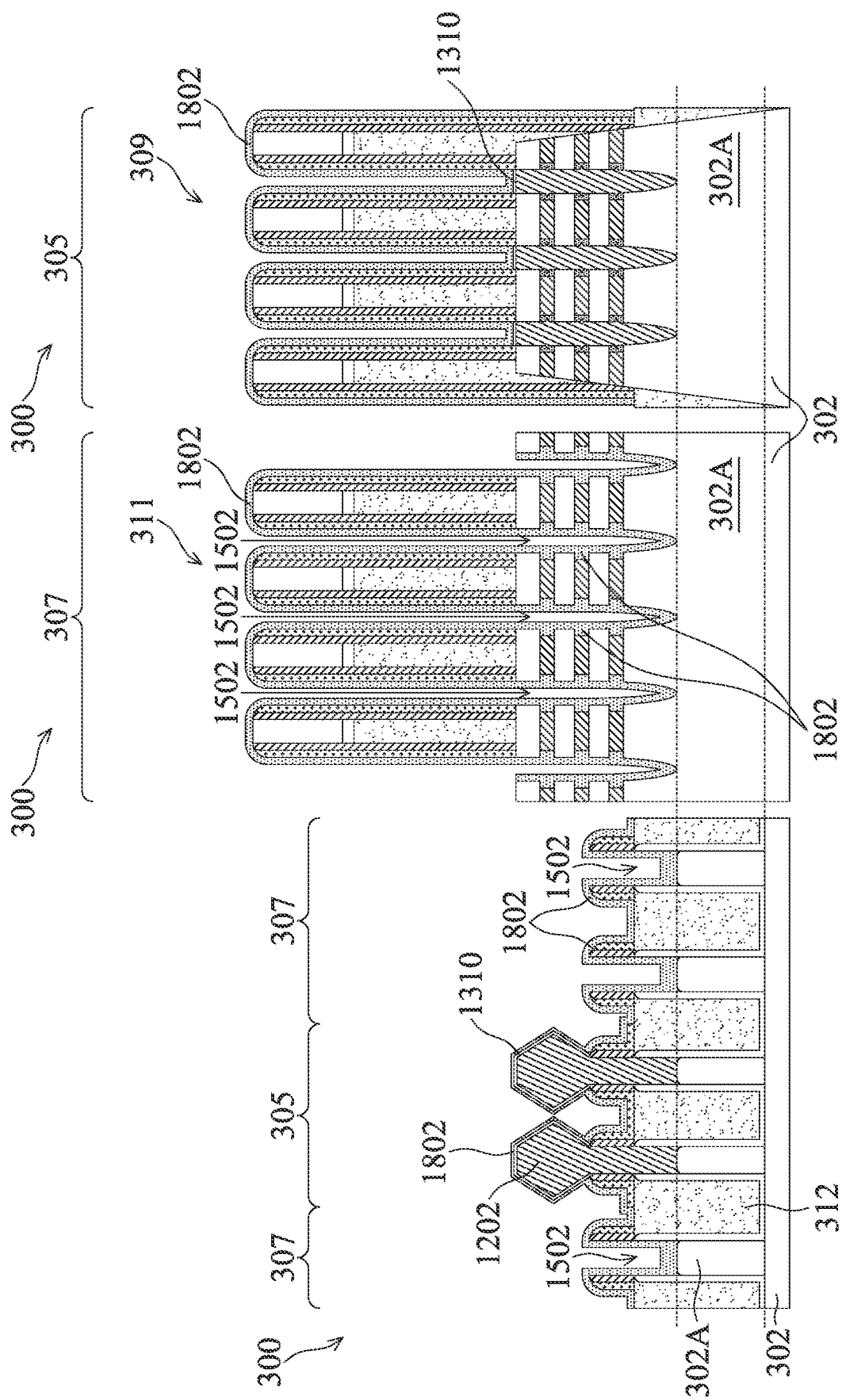

The method 200 then proceeds to block 232 where second inner spacers are formed. Referring to the example of FIGS. 18A/18B/18C and FIGS. 19A/19B/19C, in an embodiment of block 232, second inner spacers are formed in the N-type device region 307 of the device 300. FIGS. 18A and 19A provide cross-sectional views of an embodiment of the device 300 along a plane substantially parallel to a plane defined by section BB' of FIG. 1 (traversing the source/drain region of the device 300), and FIGS. 18B/18C and 19B/19C provide cross-sectional views of an embodiment of the device 300 along a plane substantially parallel to a plane defined by section AA' of FIG. 1. In some embodiments, an inner spacer material layer 1802 is first deposited over the device 300 including over both the N-type device region 307 and the P-type device region 305. In some embodiments, the inner spacer material layer 1802 may be deposited conformally over the device 300, including within the recesses 1702 and along sidewalls of the trenches 1502 within the N-type device region 307. The inner spacer material layer 1802 may also be deposited conformally over the nitride layer 1310 disposed over the P-type source/drain features 1202 in the P-type device region 305. In some examples, the inner spacer material layer 1802 may include a dielectric material such as SiCNx. More generally, and in various examples, the inner spacer material layer 1802 may include silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the inner spacer material layer 1802 may include amorphous silicon. By way of example, the inner spacer material layer 1802 may be formed by conformally depositing a dielectric material over the device 300 using processes such as a CVD process, an SACVD process, a flowable CVD process, an ALD process, a PVD process, or other suitable process.

After deposition of the inner spacer material layer 1802, and in a further embodiment of block 232, an etch-back process may be performed. In some embodiments, the etch-back process substantially removes the inner spacer material layer 1802 from the device 300, except for portions of the inner spacer material layer 1802 that remain disposed within the recesses 1702 after the etch-back process and which define inner spacers 1902 for the N-type device region 307. In various examples, the inner spacers 1902 may extend beneath sidewall spacers of the gate stacks 311, and optionally at least partially beneath the electrode layer 312 of the gate stacks 311 (e.g., depending on the size of the recesses 1702), while abutting subsequently formed source/drain features, described below.

The method 200 then proceeds to block 234 where second source/drain features are formed. With reference to FIGS. 20A/20B/20C, in an embodiment of block 234, source/drain features 2002 are formed in the N-type device region 307 of the semiconductor device 300. FIG. 20A provides a cross-sectional view of an embodiment of the device 300 along a plane substantially parallel to a plane defined by section BB' of FIG. 1 (traversing the source/drain region of the device 300), and FIGS. 20B/20C provide cross-sectional views of an embodiment of the device 300 along a plane substantially parallel to a plane defined by section AA' of FIG. 1. In some embodiments, the source/drain features 2002 are formed in source/drain regions adjacent to and on either side of the gate stacks 311 in the N-type device region 307, while the source/drain features 1202 in the P-type device region 305 remain protected by the nitride layer 1310. For example, the source/drain features 2002 may be formed within the trenches 1502 of the N-type device region 307. In some embodiments, the source/drain features 2002 are formed by epitaxially growing one or more semiconductor material layers in the source/drain regions. As previously noted, and in general, the one or more semiconductor material layers grown to form source/drain features for the device 300 may include Ge, Si, GaAs, AlGaAs, SiGe, GaAsP, SiP, SiB, SiGeBx, SiAs, SiPAsx, SiC, SiCP, or other suitable material. In various embodiments, the source/drain features 2002 abut the inner spacers 1902 and the epitaxial layers 308 (e.g., the channel layers of the GAA transistor).

The method 200 proceeds to block 236, where the second source/drain features are doped. Still referring to the example of FIGS. 20A/20B/20C, in an embodiment of block 236, the second source/drain features 2002 are doped using one or more implantation processes 2004 to provide a dopant gradient within the source/drain features 2002. In some embodiments, as part of the doping process of block 236 and prior to performing the one or more implantation processes 2004, a patterned hard mask (HM) layer 2006 is formed over the device 300. In some embodiments, the patterned HM layer 2006 includes a silicon nitride layer such as $Si_3N_4$, silicon oxynitride or silicon carbide, and may be deposited by CVD, PVD, ALD, or by another suitable process. As shown, the patterned HM layer 2006 exposes the source/drain features 2002 within the N-type device region 307, while the P-type device region 305 remains covered by the patterned HM layer 2006.

After forming the patterned HM layer 2006, the one or more implantation processes 2004 may be performed to dope the source/drain features 2002. The implantation 2004 performed into the source/drain features 2002 may include an N-type dopant implant, thereby providing N-type source/drain features. By way of example, and in some embodiments, the N-type source/drain features (e.g., the source/drain features 2002) formed within the N-type device region 307 may include SiP or an arsenic-doped epitaxial layer such as SiAs or SiPAsx. In at least some examples, the source/drain features 2002 may be formed using multiple epitaxially grown layers. For instance, in some embodiments, a first source/drain layer of the source/drain features 2002 may include a graded C-doped layer used to suppress bottom source/drain leakage current and prevent dopant out-diffusion. In some embodiments, a second source/drain layer of the source/drain features 2002 may include a lower portion and an upper portion. By way of example, the lower portion of the second source/drain layer may include a lower-doped layer (e.g., such as lightly-doped SiP or a lightly arsenic-doped layer such as SiAs or SiPAsx for the N-type source/drain features 2002) to prevent out-diffusion and/or suppress leakage current, and the upper portion of the second source/drain layer may include a higher-doped layer (e.g., heavily doped SiP or a heavily arsenic-doped layer such as SiAs or SiPAsx for the N-type source/drain features 2002) to reduce source/drain contact resistance. Thus, the upper portion and the lower portion of the second source/drain layer also collectively define a graded dopant layer (e.g., a graded P-doped or As-doped layer). It is noted that while the doping of the source/drain features 2002 is described as being performing using the one or more implantation processes 2004, in some embodiments, the source/drain features 2002 may additionally be in-situ doped (e.g., during the epi growth process). In various embodiments, and after doping the source/drain features 2002, the patterned HM layer 2006 may be removed (e.g., using a wet etching process, a dry etching process, or a combination thereof).

In various examples, the source/drain features 2002 may be formed in substantially the same manner as the source/drain features 1202. Thus, one or more aspects discussed above with reference to the source/drain features 1202 may also apply to the source/drain features 2002. For example, and in some embodiments, previously discussed FIG. 21 may also generally provide a view of a section 2008 of FIG. 20B, showing the gate stacks 311 including the electrode layer 312 and sidewall spacer layers 402 on sidewalls of the gate stacks 311. FIG. 21 may also illustrate the epitaxial layers 308, 310, the inner spacers 1902, a source/drain layer 2102, a source/drain layer 2104, and a silicide layer 2106. As previously noted, the source/drain layer 2102 may be referred to as layer "L1", and the source/drain layer 2104 may be referred to as layer "L2". As also noted, the source/drain layer 2108, which may be referred to as layer "L0", may include a separate epitaxial layer formed prior to the source/drain layer 2102 (layer "L1") and the source/drain layer 2104. In some embodiments, the layer L0 may include a graded C-doped layer (e.g., such as SiC) used to suppress bottom source/drain leakage current and prevent dopant out-diffusion. In some cases, a lower region of the layers L1 and L2 (e.g., proximate to the layer L0) may include a lower-doped layer (e.g., such as lightly-doped SiP or a lightly arsenic-doped layer such as SiAs or SiPAsx for the N-type source/drain features 2002) to prevent out-diffusion and/or suppress leakage current, and an upper region of the layers L1 and L2 may include a higher-doped layer (e.g., heavily doped SiP or a heavily arsenic-doped layer such as SiAs or SiPAsx for the N-type source/drain features 2002) to reduce source/drain contact resistance. Thus, the upper region and the lower region of the layers L1 and L2 may collectively define graded dopant layers (e.g., graded P- or As-doped layers).

In addition, and regarding the example of FIG. 21, the source/drain layer 2102 illustrates an alternative embodiment including an irregular profile of the source/drain layer 2102 that generally follows the contours of the sidewall surface collectively defined by the epitaxial layers 308 and the inner spacers 1902. As shown, and in some examples, a portion of the source/drain layer 2104 that interfaces the source/drain layer 2102 may substantially follow the irregular profile of the source/drain layer 2102. Stated another way, in some embodiments, both the source/drain layer 2102 and the source/drain layer 2104 may have the irregular profile.

As noted above, the source/drain features 2002 may be formed in substantially the same manner as the source/drain features 1202. Thus, aspects discussed above with reference to FIG. 22 may likewise apply to the source/drain features 2002. That is, in various embodiments, the source/drain features 2002, including the layers L0, L1, and L2, may also include a dopant gradient within each of the layers L0, L1, L2, configured as shown in FIG. 22. For example, a doping concentration of phosphorous (P) or boron (B) implanted into the layers L1 and L2 may be greatest at the top of the layers L1, L2, with the dopant concentration decreasing along the vertical direction toward the bottom of the layers L1, L2, as indicated by arrow 2202. Likewise, as also shown in FIG. 22, a doping concentration of carbon (C) implanted into the layer L0 may be greatest at the bottom of the layer L0, with the dopant concentration decreasing along the vertical direction toward the top of the layer L0, as indicated by arrow 2204.

In various embodiments, the composition of the layers L0, L1, L2, may be as described above. For example, when GAA transistors are used to fabricate SRAM devices, the layers L1, L2 may be doped with P (or arsenic, As, in some cases) for pass-gate (PG) or pull-down (PD) devices (e.g., N-type devices), and the layers L1, L2 may be doped with B for pull-up (PU) devices (e.g., P-type devices). Thus, in various embodiments, the layers L1, L2 may include a boron-doped epitaxial layer such as SiB or SiGeBx for the PU devices (P-type devices), and the layers L1, L2 may include SiP or an arsenic-doped epitaxial layer such as SiAs or SiPAsx for PG or PD devices (N-type devices). In some embodiments, the C implantation of the layer L0 may be used for each of the PG, PD, and PU devices. As such, in some cases, the layer L0 may include a SiC layer. Further, in at least some embodiments, the layer L0 may include boron-doped SiGe (for P-type devices) or SiP (for N-type devices).

Further, in some embodiments, the ion implant dose distribution 2206 across the regions SD1, SD2, SD3, SD4, SD5, as discussed above, may similarly apply to the source/drain features 2002. For example, within the region SD1, the fraction of the total dose of P (for PG and PD N-type devices) or the fraction of the total dose of B (for PU P-type devices), may decrease from about 100% total dose at the top of the region SD1 to about 80% total dose at the bottom of the region SD1. Within the region SD2, the fraction of the total dose of P (for PG and PD N-type devices) or the fraction of the total dose of B (for PU P-type devices), may decrease from about 80% total dose at the top of the region SD2 to about 60% total dose at the bottom of the region SD2. Within the region SD3, the fraction of the total dose of P (for PG and PD N-type devices) or the fraction of the total dose of B (for PU P-type devices), may decrease from about 60% total dose at the top of the region SD3 to about 20% total dose at the bottom of the region SD3. As another example, within the region SD5, the fraction of the total dose of C (for PG, PD N-type devices or for PU P-type devices), may decrease from about 100% total dose at the bottom of the region SD5 to about 80% total dose at the top of the region SD5, and within the region SD4, the fraction of the total dose of C (for PG, PD N-type devices or for PU P-type devices), may decrease from about 80% total dose at the bottom of the region SD4 to about 20% total dose at the top of the region SD4.

After doping the second source/drain features and removing the patterned HM layer 2006, with reference to FIGS. 23A/23B/23C and in some embodiments, the nitride layer 1310 may be removed. FIG. 23A provides a cross-sectional view of an embodiment of the device 300 along a plane substantially parallel to a plane defined by section BB' of FIG. 1 (traversing the source/drain region of the device 300), and FIGS. 23B/23C provide cross-sectional views of an embodiment of the device 300 along a plane substantially parallel to a plane defined by section AA' of FIG. 1. In some embodiments, the nitride layer 1310 may be removed using a wet etch, a dry etch, or a combination thereof. Various aspects of the FIGS. 23A/23B/23C may be substantially the same as that shown in FIGS. 20A/20B/20C. However, by way of example, FIGS. 23A/23B/23C also schematically illustrate the layers "L0", "L1", and "L2", discussed above. In some embodiments, the layer "L0" includes a bottom portion of each of the source/drain features 1202 and the source/drain features 2002. In some examples, the layer "L1" includes a portion of each of the source/drain features 1202 and the source/drain features 2002 disposed above the layer "L0". In various embodiments, the layer "L2" includes a portion of each of the source/drain features 1202 and the source/drain features 2002 disposed over the layer "L1". In some embodiments, the layer L0 may include a graded C-doped layer (e.g., such as SiC) used to suppress bottom source/drain leakage current and prevent dopant out-diffusion. In some cases, a lower region of the layers L1 and L2 (e.g., proximate to the layer L0) may include a lower-doped layer (e.g., such as lightly-doped SiP or a lightly arsenic-doped layer such as SiAs or SiPAsx for the N-type source/drain features 2002 or a lightly boron-doped SiGe for the P-type source/drain features 1202) to prevent out-diffusion and/or suppress leakage current, and an upper region of the layers L1 and L2 may include a higher-doped layer (e.g., heavily doped SiP or a heavily arsenic-doped layer such as SiAs or SiPAsx for the N-type source/drain features 2002 or a heavily boron-doped SiGe for the P-type source/drain features 1202) to reduce source/drain contact resistance.

Generally, the semiconductor device 300 may undergo further processing to form various features and regions known in the art. For example, subsequent processing may form inter-layer dielectric (ILD) layers, may remove the dummy gate stacks 309, 311, may perform a semiconductor channel release process (e.g., including selective removal of the epitaxial SiGe layers 310), and may form a high-K/metal gate stack, contact openings, contact metal, as well as various contacts/vias/lines and multilayer interconnect features (e.g., metal layers and interlayer dielectrics) on the substrate 302, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible. In some embodiments, the method 200 may be used to fabricate FinFET devices or other multi-gate devices.

Figure 24:
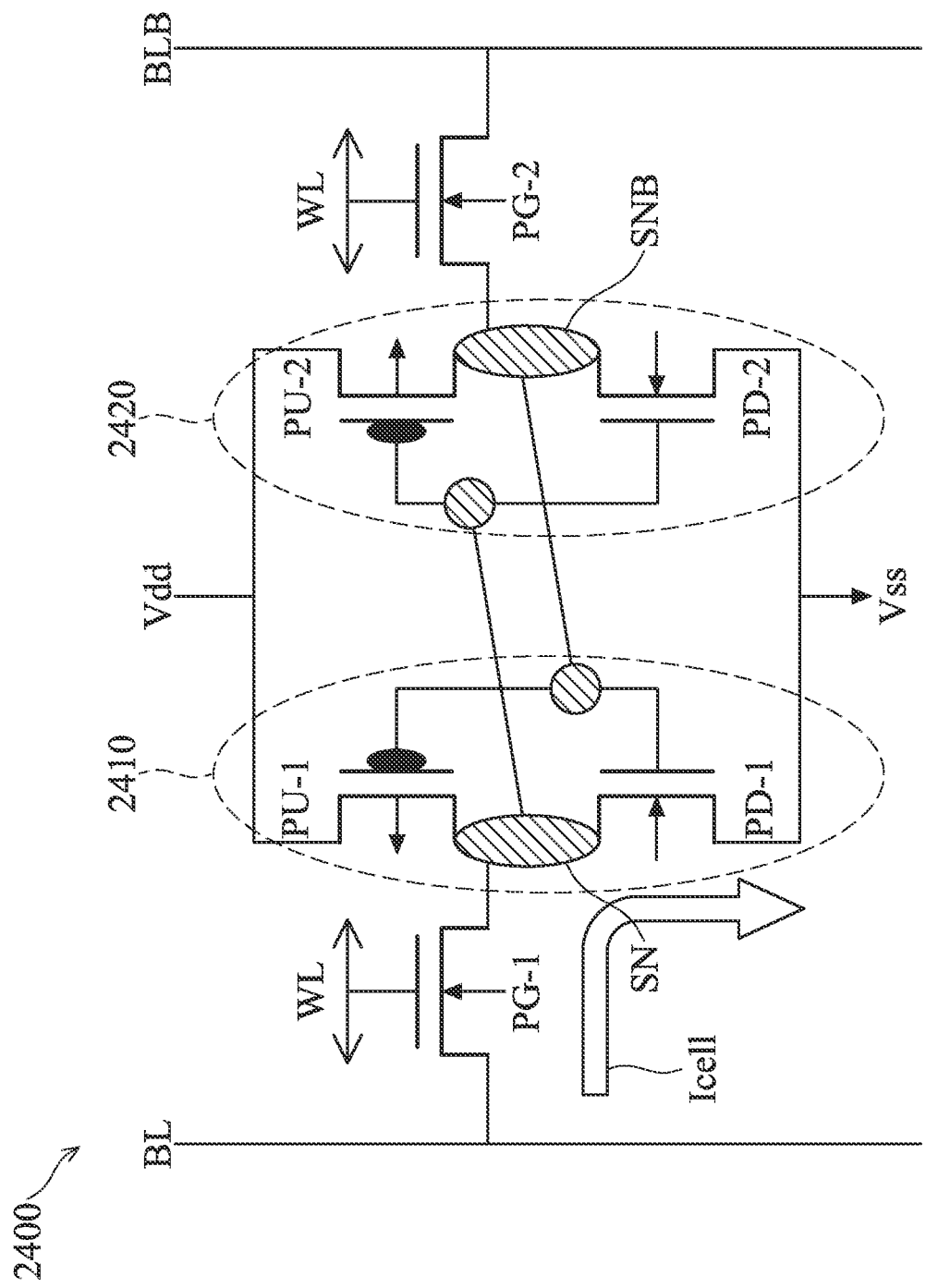
FIG. 24 provides an exemplary circuit diagram of an SRAM cell, which can be implemented in a memory cell of a SRAM array, according to various aspects of the present disclosure.

As discussed above, the method 200 may be used to fabricate GAA transistors used to implement SRAM devices. For instance, the P-type device region 305 includes P-type GAA transistors and may thus correspond to an SRAM P-type device region, and the N-type device region 307 includes N-type GAA transistors and may thus correspond to an SRAM N-type device region. To provide further detail regarding an SRAM device that may be fabricated in accordance with the disclosed methods, reference is now made to FIG. 24, which illustrates an exemplary circuit diagram of an SRAM cell 2400. In some embodiments, the SRAM cell 2400 may be implemented in a memory cell of an SRAM array. While FIG. 24 illustrates a single-port SRAM cell, it will be understood that the various disclosed embodiments may be equally implemented in a multi-port SRAM cell (e.g., such as a dual-port SRAM cell), without departing from the scope of the present disclosure. FIG. 24 has also been simplified for the sake of clarity to better understand the inventive concepts of the present disclosure. Additional features can be added in the SRAM cell 2400, and some of the features described below can be replaced, modified, or eliminated in other embodiments of SRAM cell 2400.

In some embodiments, the SRAM cell 2400 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Thus, in some examples, the SRAM cell 2400 may be referred to as a 6T SRAM cell. In operation, pass-gate transistor PG-1 and pass-gate transistor PG-2 provide access to a storage portion of the SRAM cell 2400, which includes a cross-coupled pair of inverters, an inverter 2410 and an inverter 2420. Inverter 2410 includes the pull-up transistor PU-1 and the pull-down transistor PD-1, and inverter 2420 includes the pull-up transistor PU-2 and the pull-down transistor PD-2. In some implementations, pull-up transistors PU-1, PU-2 are configured as P-type GAA transistors (or P-type FinFETs), and pull-down transistors PD-1, PD-2 are configured as N-type GAA transistors (or N-type Fin-FETs). In some implementations, pass-gate transistors PG-1, PG-2 are also configured as N-type GAA transistors (or N-type FinFETs). Thus, in various embodiments, the pull-up transistors PU-1, PU-2 may be fabricated within the P-type device region 305 and may include P-type GAA transistors fabricated in accordance with the method 200. Similarly, in some examples, the pull-down transistors PD-1, PD-2 and the pass-gate transistors PG-1, PG-2 may be fabricated within the N-type device region 307 and may include N-type GAA transistors fabricated in accordance with the method 200.

A gate of pull-up transistor PU-1 interposes a source (electrically coupled with a power supply voltage (VDD)) and a first common drain (CD1), and a gate of pull-down transistor PD-1 interposes a source (electrically coupled with a power supply voltage (VSS)) and the first common drain. A gate of pull-up transistor PU-2 interposes a source (electrically coupled with power supply voltage (VDD)) and a second common drain (CD2), and a gate of pull-down transistor PD-2 interposes a source (electrically coupled with power supply voltage (VSS)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

By employing the method 200 to fabricate SRAM devices, such as the SRAM cell 2400, such SRAM devices will have improved short-channel control, lower sub-threshold leakage, improved SRAM cell yield, and improved operation margin (e.g., including substantially balanced PG/PU threshold voltages and an optimized alpha ratio). For example, consider an SRAM cell current (Icell) that flows through the N-type pass gate transistor PG-1 and the N-type pull-down transistor PD-1. In accordance with various embodiments, the saturation drain current (Idsat) of each of the N-type pass gate transistor PG-1 and the N-type pull-down transistor PD-1 is increased, and the threshold voltage variation (Vt sigma) of each of the N-type pass gate transistor PG-1 and the N-type pull-down transistor PD-1 is decreased. As a result, and in some embodiments, the cell current (Icell) of the SRAM cell 2400 is increased and the and the Vccmin of the SRAM cell 2400 is decreased. Thus, performance (e.g., including cell read/write) of the SRAM cell 2400 is improved. Other embodiments and advantages of SRAM cells (e.g., such as the SRAM cell 2400) formed using multi-gate devices fabricated in accordance with the method 200 will be evident to those skilled in the art upon reading the present disclosure (e.g., such as improved short-channel control, lower sub-threshold leakage, improved cell yield, and improved operation margin).

With respect to the description provided herein, disclosed are methods and structures for providing multi-gate devices (e.g., such as a GAA transistors) having improved source/drain features. In some embodiments, after forming a source/drain epitaxial feature, one or more dopant implant processes are performed to dope the source/drain epitaxial feature and to provide a dopant gradient within the implanted source/drain epitaxial feature. In some embodiments, a first source/drain layer may include a graded C-doped layer used to suppress bottom source/drain leakage and prevent dopant out-diffusion. A second source/drain layer may include a graded P-doped layer, a graded As-doped layer, or a graded B-doped layer, depending on a device type. In some embodiments, the lower doping concentration of the P, As, or B dopant at the bottom of the second source/drain layer may be used to suppress bottom source/drain leakage, and the higher doping concentration of the P, As, or B dopant at the top of the second source/drain layer may be used to improve contact resistance. In accordance with the embodiments disclosed herein, the disclosed dopant gradient within the source/drain epitaxial features provides for GAA transistors having improved source/drain features, which in turn provides for SRAM devices having improved short-channel control, lower sub-threshold leakage, improved SRAM cell yield, and improved operation margin. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a fin extending from a substrate. In some embodiments, the method further includes forming a gate structure over the fin. The method further includes forming a source/drain feature within a source/drain region adjacent to the gate structure. In various examples, the method further includes doping the source/drain feature to provide a graded doping profile within the source/drain feature. In some embodiments, the graded doping profile is defined along a direction perpendicular to a top surface of the substrate.

In another of the embodiments, discussed is a method that includes providing a fin element in a device region and forming a dummy gate over the fin element. In some embodiments, the method further includes forming a source/drain feature within a source/drain region adjacent to the dummy gate. In some cases, the source/drain feature includes a bottom region and a top region contacting the bottom region at an interface interposing the top and bottom regions. In some embodiments, the method further includes performing a plurality of dopant implants into the source/drain feature. In some examples, the plurality of dopant implants includes implantation of a first dopant within the bottom region and implantation of a second dopant within the top region. In some embodiments, the first dopant has a first graded doping profile within the bottom region, and the second dopant has a second graded doping profile within the top region.

In yet another of the embodiments, discussed is a semiconductor device including a first gate structure formed over a first fin in a first device region of a substrate and a first source/drain feature adjacent to the first gate structure. In some embodiments, the first source/drain feature includes a first bottom region and a first top region contacting the first bottom region at a first interface. In some examples, the semiconductor device may further include a second gate structure formed over a second fin in a second device region of the substrate and a second source/drain feature adjacent to the second gate structure. In some cases, the second source/drain feature includes a second bottom region and a second top region contacting the second bottom region at a second interface. In various embodiments, the first bottom region and the second bottom region include a first dopant species having a first graded doping profile, the first top region includes a second dopant species having a second graded doping profile, and the second top region includes a third dopant species having a third graded doping profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first gate structure formed over a first fin in a first device region of a substrate and a first source/drain feature adjacent to the first gate structure, wherein the first source/drain feature includes a first bottom region and a first top region contacting the first bottom region at a first interface; and
a second gate structure formed over a second fin in a second device region of the substrate and a second source/drain feature adjacent to the second gate structure, wherein the second source/drain feature includes a second bottom region and a second top region contacting the second bottom region at a second interface;
wherein the first bottom region and the second bottom region include a first dopant species having a first graded doping profile, wherein the first top region includes a second dopant species having a second graded doping profile, and wherein the second top region includes a third dopant species having a third graded doping profile.

2. The semiconductor device of claim 1, wherein the first graded doping profile includes a first concentration of the first dopant species that decreases in a direction of the first interface or the second interface.

3. The semiconductor device of claim 1, wherein the second graded doping profile includes a second concentration of the second dopant species that decreases in a direction of the first interface.

4. The semiconductor device of claim 1, wherein the third graded doping profile includes a third concentration of the third dopant species that decreases in a direction of the second interface.

5. The semiconductor device of claim 1, wherein the first dopant species includes carbon, wherein the second dopant species includes boron, and wherein the third dopant species includes phosphorous.

6. The semiconductor device of claim 1, wherein the first bottom region of the first source/drain feature includes a first epitaxial layer, and wherein the first top region of the first source/drain feature includes a second epitaxial layer and a third epitaxial layer over the first epitaxial layer, the third epitaxial layer adjacent to the second epitaxial layer.

7. The semiconductor device of claim 1, wherein the second bottom region of the second source/drain feature includes a first epitaxial layer, and wherein the second top region of the second source/drain feature includes a second epitaxial layer and a third epitaxial layer over the first epitaxial layer, the third epitaxial layer adjacent to the second epitaxial layer.

8. The semiconductor device of claim 1, wherein the first device region includes a P-type device region, and wherein the second device region includes an N-type device region.

9. The semiconductor device of claim 8, wherein the first device region includes a pull-up (PU) device of a static random-access memory (SRAM) device, and wherein the second device region includes a pass-gate (PG) device or a pull-down (PD) device of the SRAM device.

10. The semiconductor device of claim 1, wherein the first top region of the first source/drain feature and the second top region of the second source/drain feature have sidewall surfaces with irregular profiles.

11. A semiconductor device, comprising:
a fin extending from a substrate;
a gate structure over the fin; and
a source/drain feature within a source/drain region adjacent to the gate structure;
wherein the source/drain feature has a graded doping profile, the graded doping profile defined along a direction perpendicular to a top surface of the substrate, wherein the source/drain feature includes a first epitaxial layer and a second epitaxial layer over the first epitaxial layer, and wherein a first doping concentration of a bottom portion of the first epitaxial layer is greater than a second doping concentration of a top portion of the first epitaxial layer.

12. The semiconductor device of claim 11, wherein the fin is disposed in a P-type device region of the substrate, and wherein the source/drain feature includes SiGe, SiB, or SiGeBx.

13. The semiconductor device of claim 11, wherein the fin is disposed in an N-type device region of the substrate, and wherein the source/drain feature includes SiP, SiAs, or SiPAsx.

14. The semiconductor device of claim 11, wherein the source/drain feature further includes a third epitaxial layer over the second epitaxial layer and adjacent to the second epitaxial layer, wherein each of the first, second, and third epitaxial layers include the graded doping profile.

15. The semiconductor device of claim 14, wherein the first epitaxial layer includes a graded carbon-doped layer.

16. The semiconductor device of claim 14, wherein the second epitaxial layer and the third epitaxial layer each include a graded phosphorous-doped layer, and wherein a first doping concentration of a top portion of each of the second and third epitaxial layers is greater than a second doping concentration of a bottom portion of each of the second and third epitaxial layers.

17. The semiconductor device of claim 14, wherein the second epitaxial layer and the third epitaxial layer each include a graded boron-doped layer, and wherein a first doping concentration of a top portion of each of the second and third epitaxial layers is greater than a second doping concentration of a bottom portion of each of the second and third epitaxial layers.

18. A semiconductor device, comprising:
a fin, wherein the fin defines a channel region;
a gate structure disposed over the channel region; and a source/drain feature adjacent to the gate structure, wherein the source/drain feature includes a plurality of epitaxial layers, each of the plurality of epitaxial layers doped with a respective dopant species having a graded dopant concentration, and wherein at least one of the plurality of epitaxial layers contacts the channel region of the fin;

wherein the plurality of epitaxial layers includes a second epitaxial layer formed over a first epitaxial layer, wherein the first epitaxial layer of the plurality of epitaxial layers has a first dopant concentration, of a first dopant species, at a bottom surface of the source/drain feature and which decreases in a direction towards a top surface of the source/drain feature, and wherein the second epitaxial layer has a second dopant concentration, of a second dopant species, at the top surface of the source/drain feature and which decreases in a direction towards the bottom surface of the source/drain feature.

19. The semiconductor device of claim 18, wherein the first dopant species includes carbon.

20. The semiconductor device of claim 18, wherein the second dopant species includes boron or phosphorous.

* * * * *